US012660380B2

(12) United States Patent
Ahn

(10) Patent No.: US 12,660,380 B2
(45) Date of Patent: Jun. 16, 2026

(54) DISPLAY DEVICE

(71) Applicant: Samsung Display Co., LTD., Yongin-si (KR)

(72) Inventor: Ho Kyun Ahn, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 795 days.

(21) Appl. No.: 17/880,338

(22) Filed: Aug. 3, 2022

(65) Prior Publication Data

US 2023/0124028 A1 Apr. 20, 2023

(30) Foreign Application Priority Data

Oct. 15, 2021 (KR) ........................ 10-2021-0137401

(51) Int. Cl.
| | |
|---|---|
| *H10H 20/831* | (2025.01) |
| *H10H 20/857* | (2025.01) |
| *H10H 29/14* | (2025.01) |

(52) U.S. Cl.
CPC ...... *H10H 20/8312* (2025.01); *H10H 20/857* (2025.01); *H10H 29/142* (2025.01)

(58) Field of Classification Search
CPC ............. H10H 20/857; H10H 20/8312; H10H 29/142; H10D 86/441; H10D 86/481; H01L 25/167; H01L 25/0753
USPC ......................................................... 257/79
See application file for complete search history.

(56) References Cited

U.S. PATENT DOCUMENTS

| | | | |
|---|---|---|---|
| 11,411,044 B2 | 8/2022 | Cho et al. | |
| 11,817,474 B2 | 11/2023 | Cho et al. | |
| 11,855,053 B2 | 12/2023 | Kong et al. | |
| 2020/0211941 A1* | 7/2020 | Xi ........................ | H10H 29/142 |
| 2021/0091050 A1 | 3/2021 | Heo et al. | |
| 2021/0134770 A1 | 5/2021 | Hwang et al. | |
| 2021/0327954 A1 | 10/2021 | Cho et al. | |
| 2022/0293822 A1 | 9/2022 | Ahn | |
| 2022/0384518 A1 | 12/2022 | Cho et al. | |
| 2022/0406759 A1 | 12/2022 | Kim | |

(Continued)

FOREIGN PATENT DOCUMENTS

| | | |
|---|---|---|
| EP | 3819940 | 5/2021 |
| KR | 2020-0004936 A | 1/2020 |

(Continued)

*Primary Examiner* — Toan Ton
(74) *Attorney, Agent, or Firm* — Womble Bond Dickinson (US) LLP

(57) ABSTRACT

A display device including: a plurality of electrodes including a first electrode on a substrate and extending in a first direction, a second electrode spaced from the first electrode in a second direction, a third electrode between the first electrode and the second electrode, and a fourth electrode spaced from the second electrode in the second direction, a first insulating layer on the plurality of electrodes, a plurality of light emitting elements on the plurality of electrodes that are spaced from each other in the second direction on the first insulating layer, a second insulating layer on the first insulating layer and the plurality of light emitting elements and including a plurality of openings, a plurality of connection electrodes on at least some of the plurality of electrodes, in contact with the plurality of light emitting elements, and spaced from each other in the first direction and the second direction.

20 Claims, 25 Drawing Sheets

(56)　　　　　　References Cited

U.S. PATENT DOCUMENTS

| 2023/0055222 | A1 | 2/2023 | Jeong et al. |
| 2024/0088198 | A1 | 3/2024 | Cho et al. |

FOREIGN PATENT DOCUMENTS

| KR | 2020-0073340 | A | 6/2020 | |
| KR | 10-2020-0102607 | A | 9/2020 | |
| KR | 2021-0055829 | A | 5/2021 | |
| KR | 2021-0103602 | A | 8/2021 | |
| KR | 10-2022-0128503 | | 9/2022 | |
| WO | WO-2020009274 | A1 * | 1/2020 | ............ H10H 20/84 |

* cited by examiner

NDA

10

DPA

DR1

DR2

PX

SPX1     SPX2     SPX3     PAS1

CTS
CTD
BNL

BP1
ED2
BP2

RME1
RME2

ED1

CT1
CT2

OPR     SA  EMA  OPR     SA  EMA  OPR     SA  EMA

DR1

DR2

RME: RME1, RME2
ED: ED1, ED2

RME: RME1, RME2
ED: ED1, ED2

PX

SPX1    SPX2    SPX3    PAS3

CTS
CTD
BNL

BP1
ED2
BP2

OP1

RME1
RME2

ED1

ROP CT1    SA    EMA    ROP    SA    EMA    ROP    SA    EMA

DR1
DR2

RME: RME1, RME2
ED: ED1, ED2

FIG. 10

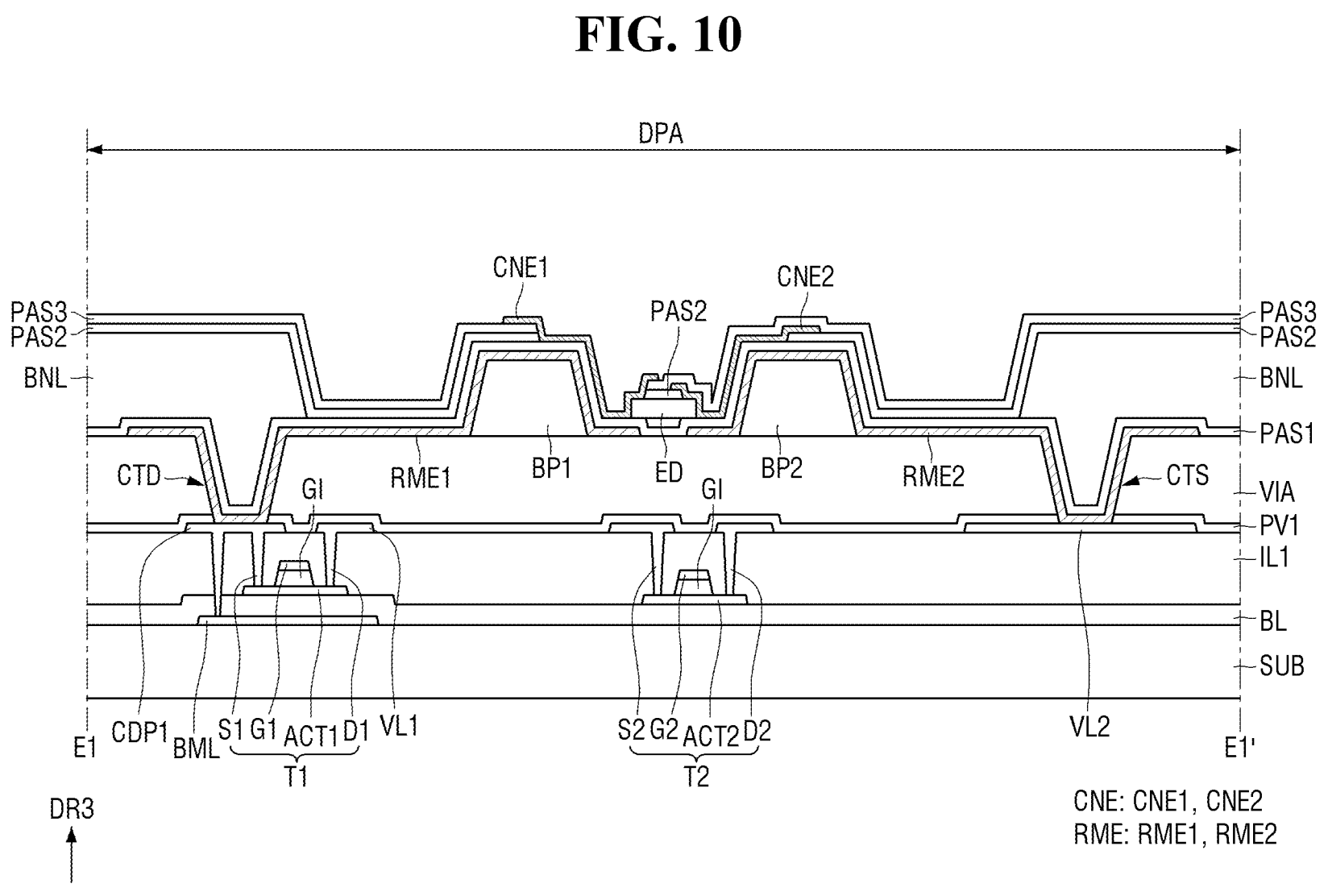

PAS3
PAS2
BNL
PAS1
VIA
PV1
IL1
BL
SUB

CTS

VL2

CNE: CNE1, CNE2
RME: RME1, RME2

DPA

RME2

CNE2

PAS2

BP2

ED    GI

S2 G2 ACT2 D2
T2

CNE1

BP1

RME1

GI

VL1

S1 G1 ACT1 D1
T1

CTD

CDP1 BML

PAS3
PAS2
BNL

RME: RME1, RME2, RME3, RME4
CNE: CNE1, CNE2, CNE3, CNE4, CNE5
ED: ED1, ED2, ED3, ED4

RME: RME1, RME2, RME3, RME4
ED: ED1, ED2, ED3, ED4

RME: RME1, RME2, RME3, RME4
ED: ED1, ED2, ED3, ED4

RME: RME1, RME2, RME3, RME4
ED: ED1, ED2, ED3, ED4

RME: RME1, RME2, RME3, RME4
ED: ED1, ED2, ED3, ED4

DISPLAY DEVICE

CROSS-REFERENCE TO RELATED APPLICATION

This application claims priority to and the benefit of Korean Patent Application No. 10-2021-0137401 filed on Oct. 15, 2021 in the Korean Intellectual Property Office, the entire content of which is incorporated by reference herein.

BACKGROUND

1. Field

The present disclosure relates to a display device.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material as a light emitting element or an inorganic light emitting display using an inorganic material as a light emitting material.

SUMMARY

Aspects and features of embodiments of the present disclosure provide a display device in which light emitting elements remaining as defects in pixels are removed.

However, aspects and features of embodiments of the disclosure are not restricted to the ones set forth herein. The above and other aspects of the present disclosure will become more apparent to one of ordinary skill in the art to which the present disclosure pertains by referencing the detailed description of the present disclosure given below.

According to one or more embodiments of the present disclosure, a display device including: a plurality of electrodes including a first electrode on a substrate and extending in a first direction, a second electrode spaced from the first electrode in a second direction, a third electrode between the first electrode and the second electrode, and a fourth electrode spaced from the second electrode in the second direction, a first insulating layer on the plurality of electrodes, a plurality of light emitting elements on the plurality of electrodes that are spaced from each other in the second direction on the first insulating layer, a second insulating layer on the first insulating layer and plurality of the light emitting elements and including a plurality of openings, a plurality of connection electrodes on at least some of the plurality of electrodes, in contact with the plurality of light emitting elements, and spaced from each other in the first direction and the second direction, wherein the second insulating layer includes a plurality of first openings overlapping the first electrode and the plurality of light emitting elements and are spaced from each other in the first direction, wherein a plurality of second openings overlaps the second electrode and the plurality of light emitting elements and are spaced from each other in the first direction, wherein a third opening does not overlap the plurality of light emitting elements and the plurality of electrodes, and wherein a fourth opening overlaps the second electrode and the third electrode without overlapping the light emitting elements.

The display device may further include a bank layer on the first insulating layer and surrounding an emission area in which the light emitting elements are located, wherein the plurality of first openings, the plurality of second openings, and the fourth opening may be located in the emission area, and the third opening is located on the bank layer.

The display device may further include one electrode of a storage capacitor located on the substrate and overlapping the bank layer, wherein the third opening may overlaps the one electrode of the storage capacitor.

The second insulating layer may further includes a plurality of fifth openings overlapping the third electrode and the plurality of light emitting elements and are spaced from each other in the first direction, and a plurality of sixth openings overlapping the fourth electrode and the plurality of light emitting elements and are spaced from each other in the first direction.

The fourth opening may be located between the plurality of fifth openings and the plurality of second openings to overlap a region between the second electrode and the third electrode.

The plurality of light emitting elements may include a first light emitting element on the first electrode and the third electrode, a second light emitting element on the second electrode and the fourth electrode, a third light emitting element on the first electrode and the third electrode and spaced from the first light emitting element in the first direction, and a fourth light emitting element on the second electrode and the fourth electrode and spaced from the second light emitting element in the first direction.

The plurality of first openings overlaps first ends of the first light emitting element and the third light emitting element, wherein the plurality of second openings overlaps second ends of the second light emitting element and the fourth light emitting element, wherein the plurality of fifth openings overlaps second ends of the first light emitting element and the third light emitting element, and wherein the plurality of sixth openings overlaps first ends of the second light emitting element and the fourth light emitting element.

The plurality of connection electrodes includes: a first connection electrode on the first electrode and overlapping a first opening from among the plurality of first openings located at a lower region of the emission area, and a second connection electrode located on the second electrode and overlapping a second opening from among the plurality of second openings located at a lower region of the emission area.

The plurality of connection electrodes further includes a third connection electrode including a first extension portion on the third electrode, and a second extension portion on the first electrode and spaced from the first connection electrode in the first direction, a fourth connection electrode including a third extension portion on the fourth electrode, and a fourth extension portion on the second electrode and spaced from the second connection electrode in the first direction, and a fifth connection electrode including a fifth extension portion on the third electrode, and a sixth extension portion on the fourth electrode and spaced from the third extension portion in the first direction.

The first extension portion may overlap the plurality of fifth openings located at the lower region of the emission area, wherein the second extension portion may overlap the plurality of first openings located at an upper region of the emission area, wherein the third extension portion may overlap the plurality of sixth openings located at the lower region of the emission area, wherein the fourth extension portion may overlap the plurality of second openings located at the upper region of the emission area, wherein the fifth extension portion may overlap the plurality of fifth openings located at the upper region of the emission area, and wherein the sixth extension portion may overlap the plurality of sixth openings located at the upper region of the emission area.

The display device may further include a third insulating layer on the second insulating layer, wherein the third insulating layer may be on the third opening and the fourth opening.

The third insulating layer may be in contact with a portion of the first insulating layer exposed by the fourth opening.

The plurality of first openings and the plurality of second openings that are located at a lower region of the emission area, and the plurality of fifth openings and the plurality of sixth openings that are located at an upper region of the emission area penetrate the third insulating layer.

Lengths of the third opening and the fourth opening measured in the first direction may be greater than lengths of each of the plurality of first openings, the plurality of second openings, the plurality of fifth openings, and the plurality of sixth openings measured in the first direction.

According to one or more embodiments of the present disclosure, a display device including: a first electrode and a second electrode spaced from the first electrode, a first insulating layer on the first electrode and the second electrode, a plurality of light emitting elements each having a first end on the first electrode and a second end on the second electrode on the first insulating layer, a bank layer on the first insulating layer and surrounding an emission area in which the plurality of light emitting elements are located, a second insulating layer on the first insulating layer and the plurality of light emitting elements and including a plurality of openings, a first connection electrode on the first electrode, and a second connection electrode on the second electrode, wherein the second insulating layer includes a first opening overlapping the first electrode and one ends of the plurality of light emitting elements, a second opening overlapping the second electrode and other ends of the plurality of light emitting elements, and a third opening that does not overlap the plurality of light emitting elements, the first electrode, and the second electrode.

The first connection electrode partially overlaps the first opening and is in contact with the one ends of the plurality of light emitting elements, and wherein the second connection electrode partially overlaps the second opening and in contact with the other ends of the plurality of light emitting elements.

The display device may further include a third insulating layer on the second insulating layer and the second connection electrode, wherein the first opening may penetrate the second insulating layer and the third insulating layer.

The third insulating layer covers the second opening and the third opening.

The third opening overlaps the bank layer.

The second insulating layer may further include a fourth opening on the first electrode without overlapping the plurality of light emitting elements.

In the display device according to one or more embodiments, an insulating layer disposed on light emitting elements may include an opening formed in a region where the light emitting elements are not aligned. The insulating layer may not cover misaligned light emitting elements, and light emitting elements seated in a region other than an alignment region may be removed.

The display device according to one or more embodiments may prevent the misaligned light emitting elements in pixels from remaining defective, and in a defect inspection of the display device, there is an effect that it is easy to inspect foreign substances or dark spots formed in lower conductive layers.

However, the effects, aspects, and features of embodiments of the disclosure are not limited to the aforementioned effects, aspects, and features and various other effects, aspects, and features are included in the specification.

BRIEF DESCRIPTION OF THE DRAWINGS

The above and other aspects and features of embodiments of the present disclosure will become more apparent by describing in detail embodiments thereof with reference to the attached drawings, in which:

FIG. 10 is a cross-sectional view taken along the line E1-E1' of FIG. 4;

FIG. 11 is a cross-sectional view taken along the line E2-E2' of FIG. 4;

DETAILED DESCRIPTION

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
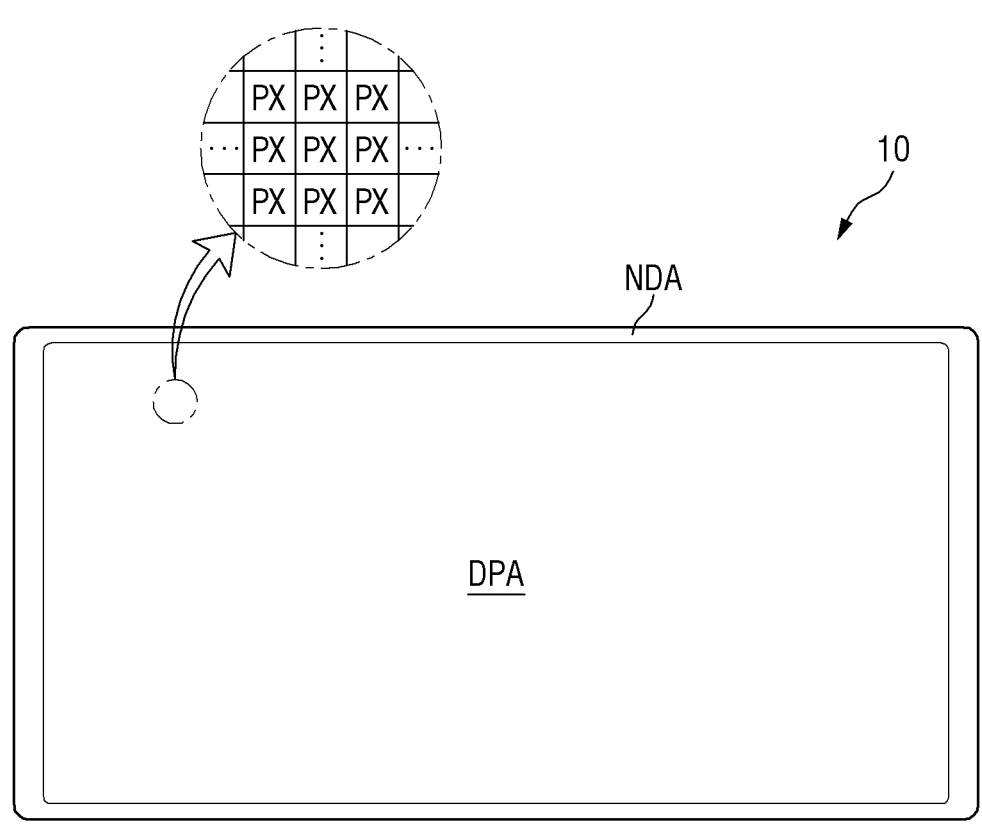
FIG. 1 is a schematic plan view of a display device according to one or more embodiments.
Figure 1:
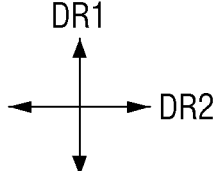

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the present disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (e.g., vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA around the edge or periphery of the display area DPA. The display area DPA is an area where an image can be displayed, and the non-display area NDA is an area where no image is displayed. The display area DPA may also be referred to as an active region, and the non-display area NDA may also be referred to as a non-active region. The display area DPA may substantially occupy the center of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be a rectangular or square shape in a plan view. However, the present disclosure is not limited thereto, and it may be a rhombic shape in which each side is inclined with respect to one direction. The pixels PX may be arranged in a stripe type or an island type or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
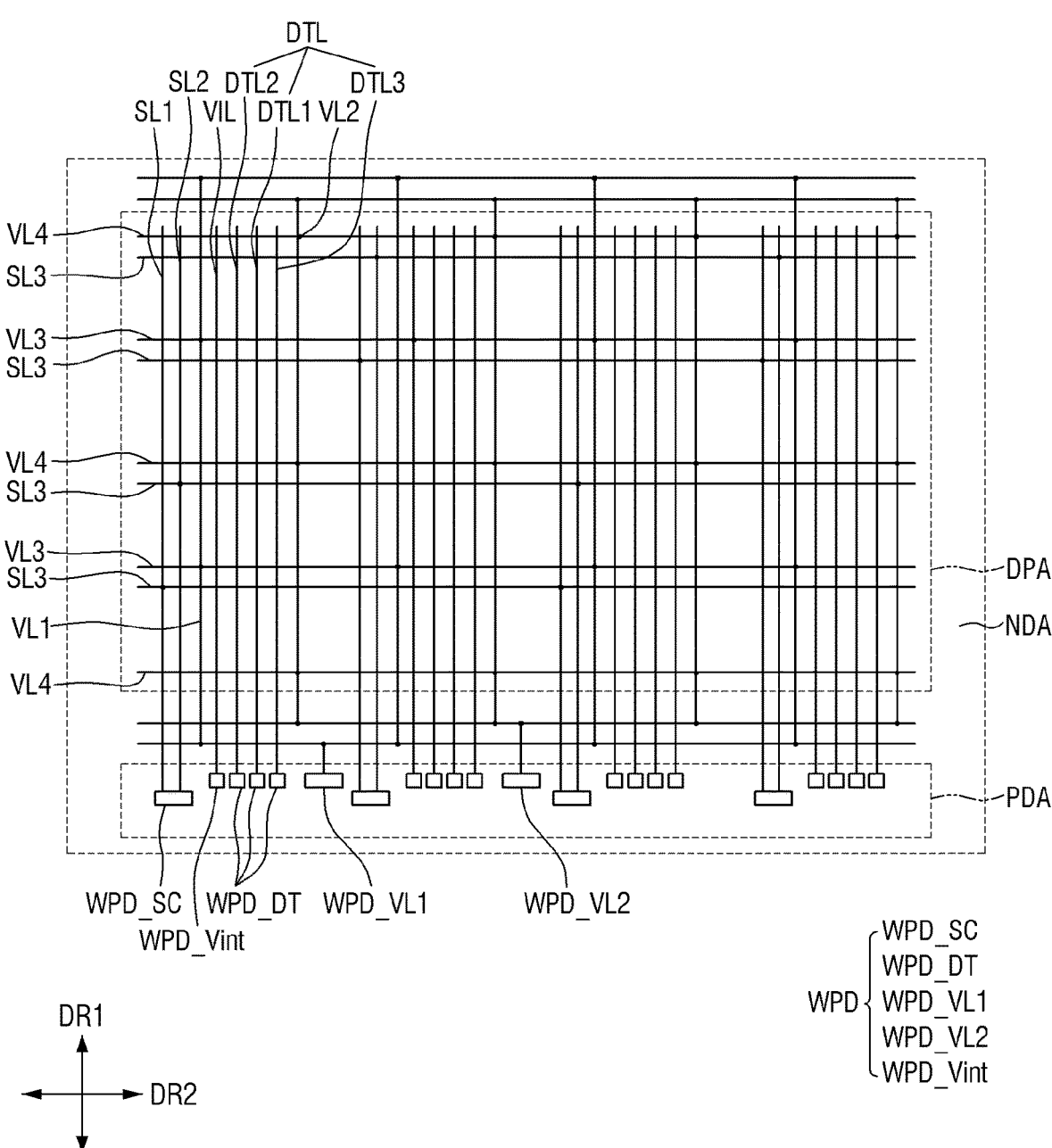
FIG. 2 is a plan view illustrating an arrangement of a plurality of wires included in a display device according to one or more embodiments.

FIG. 2 is a plan view illustrating an arrangement of a plurality of wires included in a display device according to one or more embodiments.

Referring to FIG. 2, the display device 10 may include a plurality of wires. The display device 10 may include a plurality of scan lines SL1, SL2, and SL3, a plurality of data lines DTL1, DTL2, and DTL3, an initialization voltage line VIL, and a plurality of voltage lines VL1, VL2, VL3, and VL4. Although not shown in the drawing, other wires may be further provided in the display device 10.

The first scan line SL1 and the second scan line SL2 may be disposed to extend in the first direction DR1. The first scan line SL1 and the second scan line SL2 may be disposed adjacent to each other, and may be disposed to be spaced from the different first scan line SL1 and second scan line SL2 in the second direction DR2. The first scan line SL1 and the second scan line SL2 may be connected to a scan line pad WPD_SC connected to a scan driver. The first scan line SL1 and the second scan line SL2 may be disposed to extend from the pad area PDA disposed in the non-display area NDA to the display area DPA.

The third scan line SL3 may be disposed to extend in the second direction DR2, and may be disposed to be spaced from the other third scan line SL3 in the first direction DR1. One third scan line SL3 may be connected to one or more first scan lines SL1 or one or more second scan lines SL2. In one or more embodiments, the first scan line SL1 and the second scan line SL2 may be formed as a conductive layer disposed on a different layer from the third scan line SL3. The plurality of scan lines SL may have a mesh structure in the entire surface of the display area DPA, but is not limited thereto.

In one or more embodiments, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data lines DTL may be disposed to extend in the first direction DR1. The data line DTL includes a first data line DTL1, a second data line DTL2, and a third data line DTL3, and each one of the first to third data lines DTL1, DTL2, and DTL3 forms a pair and is disposed adjacent to each other. Each of the data lines DTL1, DTL2, and DTL3 may be disposed to extend from the pad area PDA disposed in the non-display area NDA to the display area DPA. However, the present disclosure is not limited thereto, and the plurality of data lines DTL may be spaced from each other at equal intervals between a first voltage line VL1 and a second voltage line VL2 to be described later.

The initialization voltage line VIL may be disposed to extend in the first direction DR1. The initialization voltage line VIL may be disposed between the data lines DTL and the first scan line SL1 and the second scan line SL2. The initialization voltage line VIL may be disposed to extend from the pad area PDA disposed in the non-display area NDA to the display area DPA.

The first voltage line VL1 and the second voltage line VL2 are disposed to extend in the first direction DR1, and the third voltage line VL3 and the fourth voltage line VL4 are disposed to extend in the second direction DR2. The first voltage line VL1 and the second voltage line VL2 may be alternately disposed along the second direction DR2, and the third voltage line VL3 and the fourth voltage line VL4 may be alternately disposed along the first direction DR1. The first voltage line VL1 and the second voltage line VL2 may be disposed to extend in the first direction DR1 to cross the display area DPA, and as for the third voltage line VL3 and the fourth voltage line VL4, some of the wires may be disposed in the display area DPA and other wires may be disposed in the non-display area NDA positioned on both sides of the display area DPA in the first direction DR1, respectively. The first voltage line VL1 and the second voltage line VL2 may be formed as a conductive layer disposed on a different layer from the third voltage line VL3 and the fourth voltage line VL4. The first voltage line VL1 may be connected to at least one third voltage line VL3, the second voltage line VL2 may be connected to at least one fourth voltage line VL4, and the plurality of voltage lines VL may have a mesh structure in the entire display area DPA. However, the present disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In one or more embodiments, each of the line pads WPD may be disposed in the pad area PDA positioned on the lower side, which is the other side of the display area DPA in the first direction DR1. The first scan line SL1 and the second scan line SL2 are connect to the scan line pad WPD_SC disposed in the pad area PDA, and the plurality of data lines DTL are connected to the data line pads WPD_DT different from each other, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by applying an anisotropic conductive film, ultrasonic bonding or the like. The drawing exemplifies that each of the line pads WPD is disposed on the pad area PDA disposed on the lower side of the display area DPA, but is not limited thereto. Some of the plurality of line pads WPD may be disposed in any one area on the upper side or on the left and right sides of the display area DPA.

Each pixel PX or sub-pixel SPXn (n being an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one or more embodiments, in each sub-pixel SPXn of the display device 10, the pixel driving circuit may have a 3T1C structure including three transistors and one capacitor. Hereinafter, the pixel driving circuit of the 3T1C structure will be described as an example, but the present disclosure is not limited thereto, and various other modified structures such as a 2T1C structure, a 7T1C structure, and a 6T1C structure may be applied.

Figure 3:
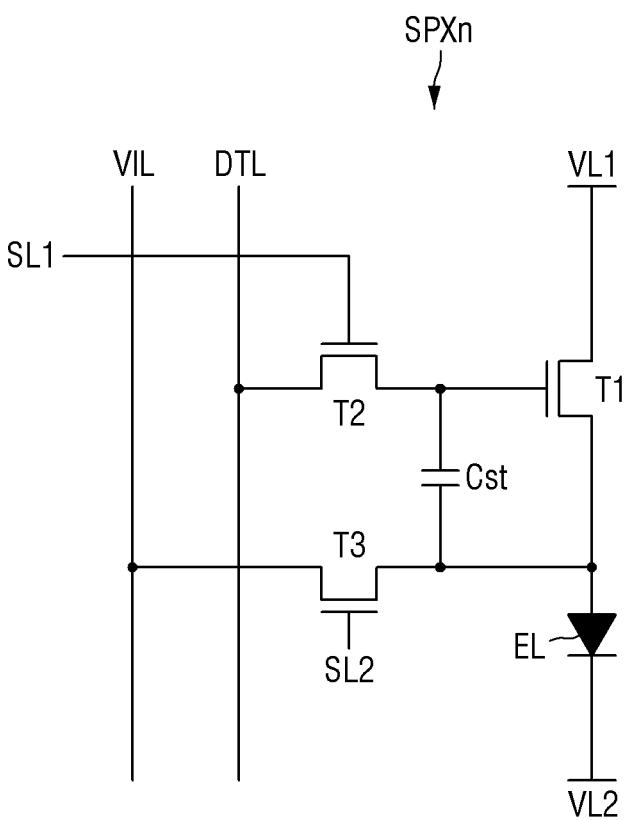
FIG. 3 is an equivalent circuit diagram of a sub-pixel according to one or more embodiments.

FIG. 3 is an equivalent circuit diagram of a sub-pixel according to one or more embodiments.

Referring to FIG. 3, each sub-pixel SPXn of the display device 10 according to one or more embodiments includes three transistors T1, T2 and T3 and one storage capacitor Cst in addition to a light emitting diode EL.

The light emitting diode EL emits light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode of the first transistor T1. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of the second scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

In the drawing, it is illustrated that the gate electrodes of the second transistor T2 and the third transistor T3 are electrically connected to different scan lines SL1 and SL2, respectively, but the present disclosure is not limited thereto. In one or more embodiments, the gate electrodes of the second transistor T2 and the third transistor T3 may be electrically connected to the same scan line.

In one or more embodiments, the source electrode and the drain electrode of each of the transistors T1, T2, and T3 are not limited to those described above, and vice versa. Further, each of the transistors T1, T2, and T3 may be formed of a thin film transistor (TFT). In addition, in FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, some of the transistors T1, T2, and T3 may be formed of an N-type MOSFET and the others may be formed of a P-type MOS-FET.

The storage capacitor Cst is formed between the gate electrode and the source electrode of the first transistor T1. The storage capacitor Cst stores a difference voltage between a gate voltage and a source voltage of the first transistor T1.

Hereinafter, a structure of one pixel PX of the display device 10 according to one or more embodiments will be described in detail with further reference to other drawings.

Figure 4:
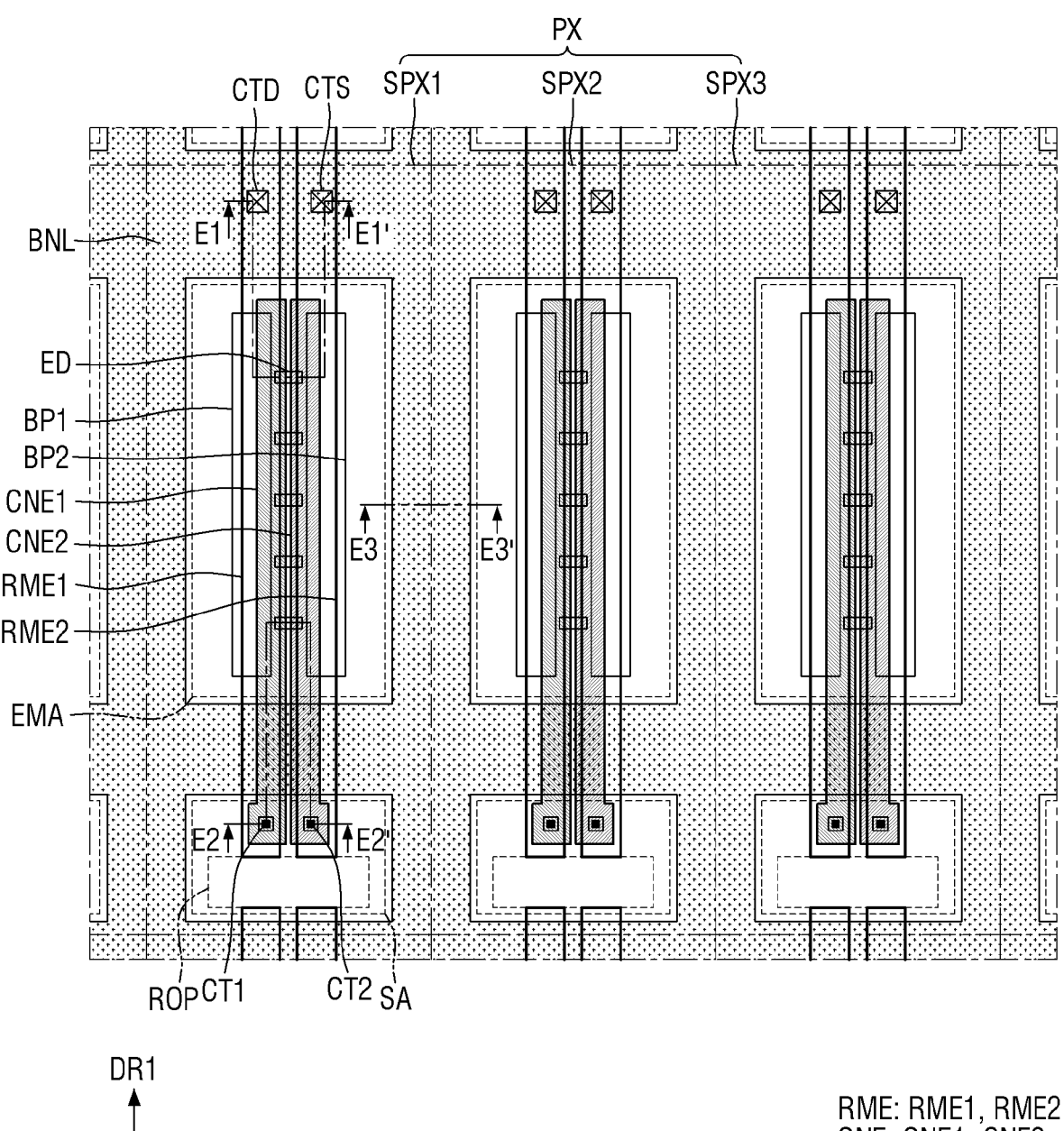
FIG. 4 is a plan view illustrating one pixel of a display device according to one or more embodiments.

FIG. 4 is a plan view illustrating one pixel of a display device according to one or more embodiments. FIG. 4 illustrates planar arrangement of electrodes RME (RME1 and RME2), bank patterns BP1 and BP2, a bank layer BNL, a plurality of light emitting elements ED (ED1 and ED2), and connection electrodes CNE (CNE1 and CNE2) disposed in one pixel PX of the display device 10.

Referring to FIG. 4, each of the pixels PX of the display device 10 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one or more embodiments, each of the sub-pixels SPXn may emit blue light. Although it is illustrated in the drawing that one pixel PX includes three sub-pixels SPXn, the present disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The plurality of light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the present disclosure is not limited thereto. In one or more embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which is the other side in the first direction DR1. The emission area EMA and the sub-region SA may be alternately arranged along the first direction DR1, and the sub-region SA may be disposed between the emission areas EMA of different sub-pixels SPXn that are spaced from each other in the first direction DR1. For example, the emission area EMA and the sub-region SA may be alternately arranged along the first direction DR1, and each of the emission area EMA and the sub-region SA may be repeatedly arranged along the second direction DR2. However, the present disclosure is not limited thereto, and the arrangement of the emission areas EMA and the sub-regions SA in the plurality of pixels PX may be different from that shown in FIG. 4.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

Each of the wires and the circuit elements of a circuit layer disposed on each pixel PX and connected to the light emitting diode EL may be connected to the first to third sub-pixels SPX1, SPX2, and SPX3. However, the wires and the circuit elements may not be disposed to correspond to the area occupied by each sub-pixel SPXn or the emission area EMA, and may be disposed regardless of the position of the emission area EMA within one pixel PX.

The bank layer BNL may be disposed to be around (or to surround) the plurality of sub-pixels SPXn, the emission area EMA, and the sub-region SA. The bank layer BNL may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the plurality of sub-pixels SPXn, the emission areas EMA, and the sub-regions SA may vary depending on the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to be around (or surround) the emission area EMA and the sub-region SA disposed for each sub-pixel SPXn to delimit them from each other.

Figure 5:
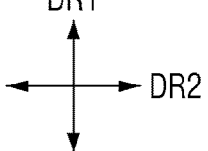
FIG. 5 is a plan view illustrating a first insulating layer disposed in one pixel of FIG. 4.
Figure 6:
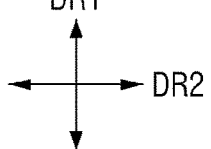
FIG. 6 is a plan view illustrating a second insulating layer disposed in one pixel of FIG. 4.
Figure 7:
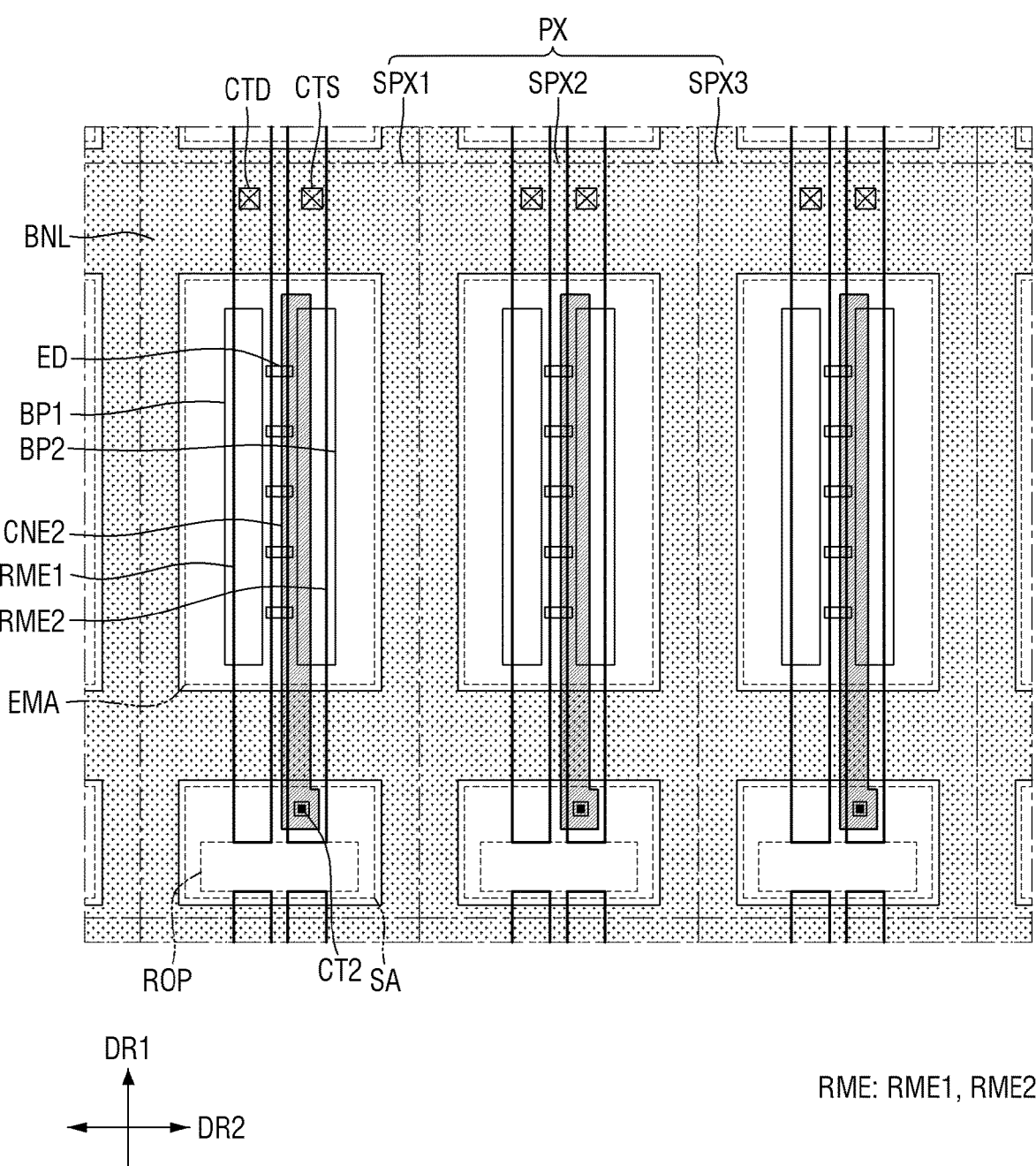
FIG. 7 is a plan view illustrating a first connection electrode layer disposed in one pixel of FIG. 4.
Figure 8:
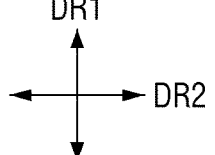
FIG. 8 is a plan view illustrating a third insulating layer disposed in one pixel of FIG. 4.
Figure 9:
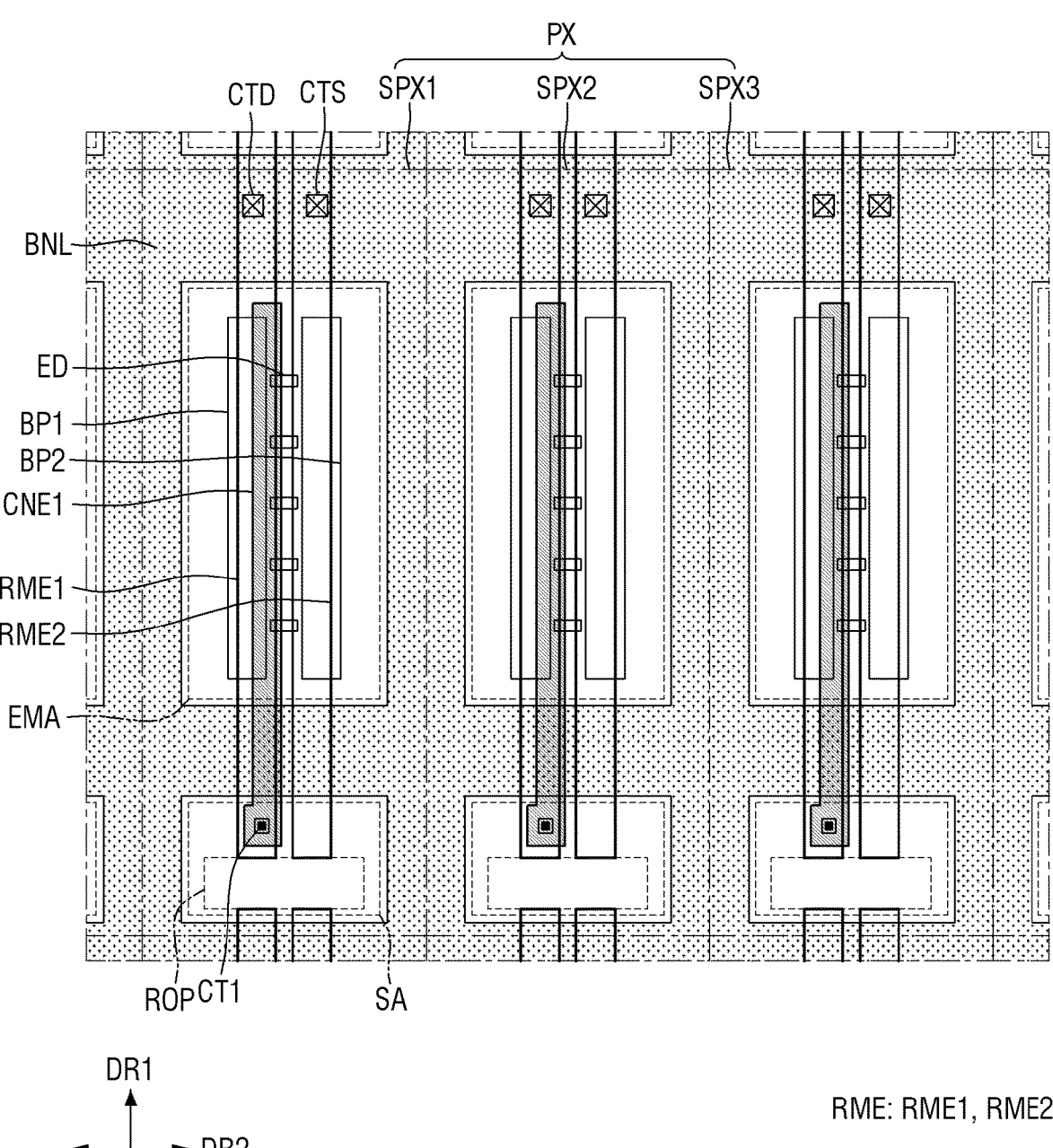
FIG. 9 is a plan view illustrating a second connection electrode layer disposed in one pixel of FIG. 4.
Figure 11:
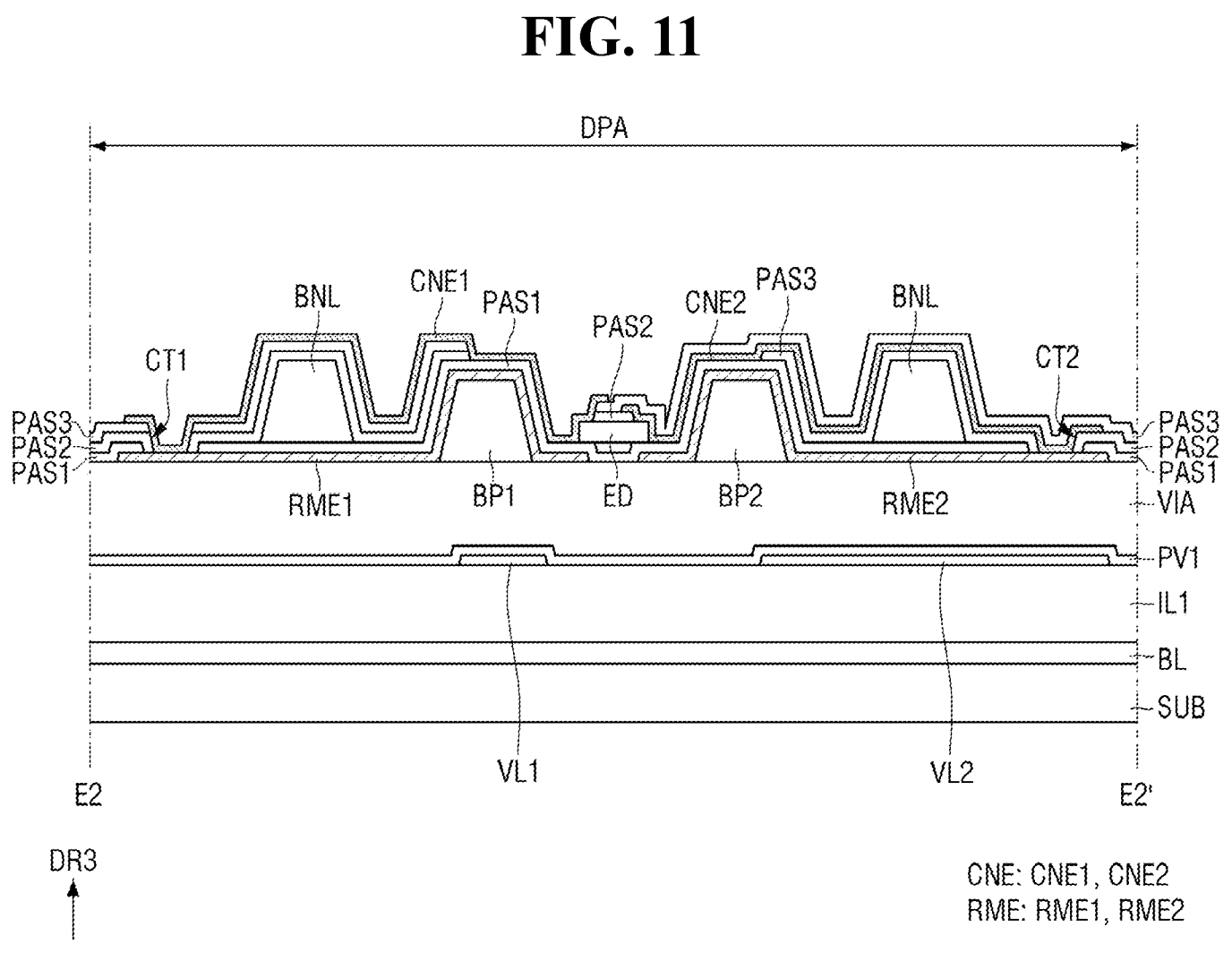
Figure 12:
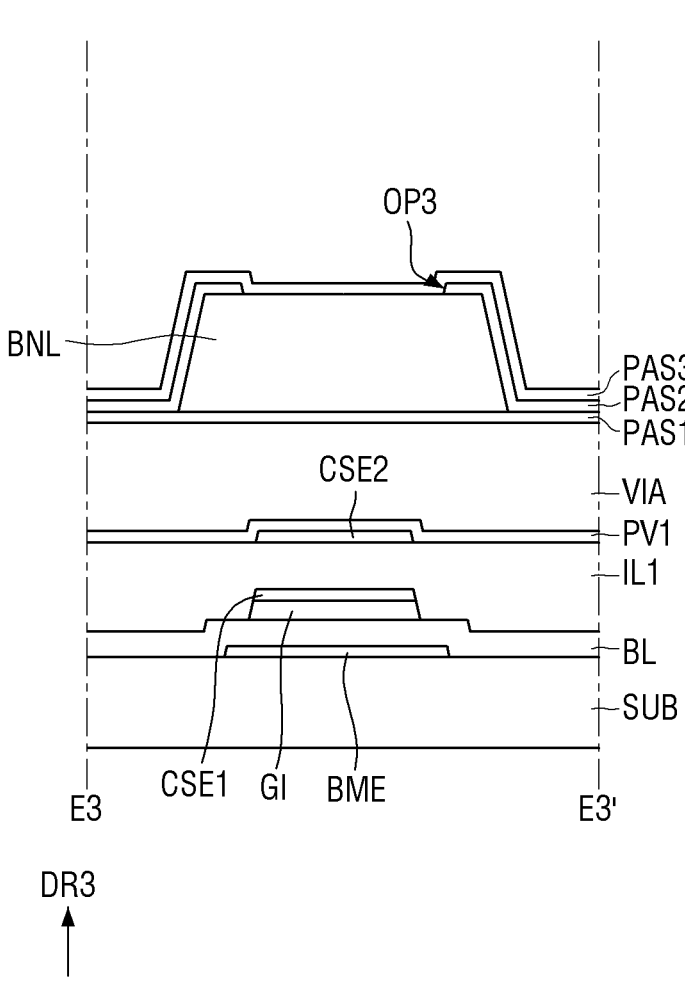
FIG. 12 is a cross-sectional view taken along the line E3-E3' of FIG. 4.

FIG. 5 is a plan view illustrating a first insulating layer disposed in one pixel of FIG. 4. FIG. 6 is a plan view illustrating a second insulating layer disposed in one pixel of FIG. 4. FIG. 7 is a plan view illustrating a first connection electrode layer disposed in one pixel of FIG. 4. FIG. 8 is a plan view illustrating a third insulating layer disposed in one pixel of FIG. 4. FIG. 9 is a plan view illustrating a second connection electrode layer disposed in one pixel of FIG. 4. FIG. 10 is a cross-sectional view taken along the line E1-E1' of FIG. 4. FIG. 11 is a cross-sectional view taken along the line E2-E2' of FIG. 4. FIG. 12 is a cross-sectional view taken along the line E3-E3' of FIG. 4.

FIGS. 5 to 9 illustrate the planar arrangement of a plurality of insulating layers PAS1, PAS2, and PAS3 that are different layers disposed in one pixel PX, and the connection electrodes CNE1 and CNE2. FIG. 5 illustrates the planar arrangement of the first insulating layer PAS1 disposed under the bank layer BNL, and FIGS. 6 and 8 illustrate the planar arrangement of the second insulating layer PAS2 and the third insulating layer PAS3 disposed above the bank layer BNL. FIG. 10 illustrates a cross section across both ends of the light emitting element ED and electrode contact holes CTD and CTS disposed in the first sub-pixel SPX1, and FIG. 11 illustrates a cross section across both ends of the light emitting element ED and contact portions CT1 and CT2 disposed in the first sub-pixel SPXn. FIG. 12 illustrates a cross section across the bank layer BNL between the sub-pixels SPXn in the second direction DR2.

Referring to FIGS. 4 and 5 to 12, the display device 10 may include a first substrate SUB and a semiconductor layer, a plurality of conductive layers, and a plurality of insulating layers disposed on the first substrate SUB. In addition, the display device 10 may include the plurality of electrodes RME (RME1 and RME2), the light emitting element ED, and the connection electrodes CNE (CNE1 and CNE2). The semiconductor layer, the conductive layers, and the insulating layers may each constitute a circuit layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded or rolled. The first substrate SUB may include the display area DPA and the non-display area NDA around (or surrounding) the display area DPA, and the display area DPA may include the emission area EMA and the sub-region SA that is a part of the non-emission area.

A first conductive layer may be disposed on the first substrate SUB. The first conductive layer includes a lower metal layer BML that is disposed to overlap a first active layer ACT1 of a first transistor T1 in a thickness direction of the substrate SUB (e.g., a third direction DR3). The lower metal layer BML may prevent light from being incident on the first active layer ACT1 of the first transistor or may be electrically connected to the first active layer ACT1 to perform a function of stabilizing the electrical characteristics of the first transistor T1. However, the lower metal layer BML may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively, in the third direction DR3.

The semiconductor layer may include polycrystalline silicon, monocrystalline silicon, oxide semiconductor, and the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IG-ZTO).

Although it is illustrated in the drawing that one first transistor T1 is disposed in the sub-pixel SPXn of the display device 10, but the disclosure is not limited thereto, and the display device 10 may include a larger number of transistors.

A first gate insulating layer GI is disposed on the semiconductor layer in the display area DPA. The first gate insulating layer GI may not be disposed in the pad area PDA. The first gate insulating layer GI may serve as a gate insulating film of each of the transistors T1 and T2. In the drawings, it is illustrated that the first gate insulating layer GI is patterned together with the gate electrodes G1 and G2 of the second conductive layer to be described later, and is partially disposed between the second conductive layer and the active layers ACT1 and ACT2 of the semiconductor layer. However, the present disclosure is not limited thereto. In one or more embodiments, the first gate insulating layer GI may be entirely disposed on the buffer layer BL.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that is a thickness direction, and the second gate electrode G2 may be disposed to overlap the channel region of the second active layer ACT2 in the third direction DR3 that is the thickness direction. In one or more embodiments, the second conductive layer may further include one electrode of the storage capacitor.

A first interlayer insulating layer IL1 is disposed on the second conductive layer. The first interlayer insulating layer IL1 may function as an insulating film between the second conductive layer and other layers disposed thereon, and may protect the second conductive layer.

A third conductive layer is disposed on the first interlayer insulating layer IL1. The third conductive layer may include the first voltage line VL1 and the second voltage line VL2, a first conductive pattern CDP1, a source electrode S1 and a drain electrode D1 of the transistor T1, and a source electrode S2 and a drain electrode D2 of the transistor T2 that are disposed in the display area DPA. In one or more embodiments, the third conductive layer may further include the other electrode of the storage capacitor.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. A part of the first voltage line VL1 may be in contact with the first active layer ACT1 of the first transistor T1 through the contact hole penetrating the first interlayer insulating layer IL1. The first voltage line VL1 may serve as a first drain electrode D1 of the first transistor T1. The second voltage line VL2 may be directly connected to the second electrode RME2 to be described later.

The first conductive pattern CDP1 may be in contact with the first active layer ACT1 of the first transistor T1 through the contact hole penetrating the first interlayer insulating layer IL1. The first conductive pattern CDP1 may be in contact with the lower metal layer BML through another contact hole penetrating the first interlayer insulating layer IL1 and the buffer layer BL. The first conductive pattern CDP1 may serve as a first source electrode S1 of the first transistor T1. Further, the first conductive pattern CDP1 may be connected to the first electrode RME1 or the first connection electrode CNE1 to be described later. The first transistor T1 may transmit the first power voltage applied from the first voltage line VL1 to the first electrode RME1 or the first connection electrode CNE1.

The second source electrode S2 and the second drain electrode D2 may be in contact with the second active layer ACT2 of the second transistor T2 through the respective contact holes penetrating the first interlayer insulating layer IL1. The second transistor T2 may be any one of the switching transistors described with reference to FIG. 3. The second transistor T2 may transfer the signal applied from the data line DTL of FIG. 3 to the first transistor T1 or may transfer the signal applied from the initialization voltage line VIL of FIG. 3 to the other electrode of the storage capacitor.

A first passivation layer PV1 is disposed on the third conductive layer and the first interlayer insulating layer IL1. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed of a plurality of inorganic layers stacked in an alternating manner. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the present disclosure is not limited thereto, and the buffer layer BL, the first gate insulating layer GI, the first interlayer insulating layer IL1, and the first passivation layer PV1 may be formed as a single inorganic layer containing the above-described insulating material. Further, in one or more embodiments, the first interlayer insulating layer IL1 may be made of an organic insulating material such as polyimide (PI) or the like.

A via layer VIA is disposed on the third conductive layer in the display area DPA. The via layer VIA may contain an organic insulating material, e.g., polyimide (PI), and may compensate the stepped portion formed by the conductive layers disposed thereunder to flatten the top surface. However, in one or more embodiments, the via layer VIA may be omitted.

The display device 10 may include, as a display element layer disposed on the via layer VIA, the bank patterns BP1 and BP2, the plurality of electrodes RME (RME1 and RME2), the bank layer BNL, the plurality of light emitting elements ED, and the plurality of connection electrodes CNE (CNE1 and CNE2). In addition, the display device 10 may include the insulating layers PAS1, PAS2, and PAS3 disposed on the via layer VIA.

The plurality of bank patterns BP1 and BP2 may be disposed in the emission area EMA of each sub-pixel SPXn. The bank patterns BP1 and BP2 may have a predetermined width in the second direction DR2 and may have a shape extending in the first direction DR1.

For example, the bank patterns BP1 and BP2 may include a first bank pattern BP1 and a second bank pattern BP2 spaced from each other in the second direction DR2 in the emission area EMA of each sub-pixel SPXn. The first bank pattern BP1 may be disposed on the left side with respect to the center of the emission area EMA, which is one side in the second direction DR2, and the second bank patterns BP2 may be disposed on the right side with respect to the center of the emission area EMA, which is the other side in the second direction DR2, while being spaced from the first bank pattern BP1. The first bank pattern BP1 and the second bank pattern BP2 may be alternately disposed along the second direction DR2 and may be disposed in an island-shaped pattern in the display area DPA. The plurality of light emitting elements ED may be arranged between the first bank pattern BP1 and the second bank pattern BP2.

The lengths of the first bank pattern BP1 and the second bank pattern BP2 in the first direction DR1 may be the same, and may be smaller than the length of the emission area EMA surrounded by the bank layer BNL in the first direction DR1. The first bank pattern BP1 and the second bank pattern BP2 may be spaced from a portion of the bank layer BNL extending in the second direction DR2. However, the present disclosure is not limited thereto, and the bank patterns BP1 and BP2 may be integrated with the bank layer BNL, or may partially overlap the portion of the bank layer BNL extending in the second direction DR2. In this case, the lengths of the bank patterns BP1 and BP2 in the first direction DR1 may be greater than or equal to the length of the emission area EMA surrounded by the bank layer BNL in the first direction DR1.

The widths of the first bank pattern BP1 and the second bank pattern BP2 in the second direction DR2 may be the same. However, the present disclosure is not limited thereto, and they may have different widths. For example, one bank pattern may have a larger width than the other bank pattern, and the bank pattern having a larger width may be disposed across the emission areas EMA of different sub-pixels SPXn adjacent in the second direction DR2. In this case, in the bank pattern disposed across the plurality of emission areas EMA, a portion of the bank layer BNL extending in the first direction DR1 may overlap the second bank pattern BP2 in the thickness direction (e.g., the third direction DR3). Although it is illustrated in the drawing that two bank patterns BP1 and BP2 having the same width are arranged for each sub-pixel SPXn, the present disclosure is not limited thereto. The number and the shape of the bank patterns BP1 and BP2 may vary depending on the number or the arrangement structure of the electrodes RME.

The plurality of bank patterns BP1 and BP2 may be disposed on the via layer VIA. For example, each of the bank patterns BP1 and BP2 may be directly disposed on the via layer VIA, and may have a structure in which at least a part thereof protrudes with respect to the top surface of the via layer VIA. The protruding parts of the bank patterns BP1 and BP2 may have an inclined surface or a curved surface with a certain curvature, and the light emitted from the light emitting element ED may be reflected by the electrode RME disposed on the bank patterns BP1 and BP2 and emitted in the upward direction of the via layer VIA. Unlike the example illustrated in the drawing, the bank patterns BP1 and BP2 may have a shape, e.g., a semicircular or semi-elliptical shape, in which the outer surface is curved with a certain curvature in cross-sectional view. The bank patterns BP1 and BP2 may include an organic insulating material such as polyimide (PI), but is not limited thereto.

The plurality of electrodes RME (RME1 and RME2) have a shape extending in one direction and are disposed for each sub-pixel SPXn. The plurality of electrodes RME1 and RME2 may extend in the first direction DR1 to be disposed across the emission area EMA of the sub-pixel SPXn and the sub-region SA, and may be disposed to be spaced from each other in the second direction DR2. The plurality of electrodes RME may be electrically connected to the light emitting element ED to be described later, but the present disclosure is not limited thereto. The electrodes RME may not be electrically connected to the light emitting element ED.

The display device 10 may include the first electrode RME1 and the second electrode RME2 arranged in each sub-pixel SPXn. The first electrode RME1 is located on the left side with respect to the center of the emission area EMA, and the second electrode RME2 is located on the right side with respect to the center of the emission area EMA while being spaced from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of one sub-pixel SPXn.

Although it is illustrated in the drawing that two electrodes RME have a shape extending in the first direction DR1 for each sub-pixel SPXn, the present disclosure is not limited thereto. For example, the display device 10 may have a shape in which a larger number of electrodes RME are disposed in one sub-pixel SPXn or the electrodes RME are partially bent and have different widths depending on positions.

The first electrode RME1 and the second electrode RME2 may be arranged at least on the inclined surfaces of the bank patterns BP1 and BP2. In one or more embodiments, the widths of the plurality of electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a part of the first electrode RME1 and the second electrode RME2 may be directly arranged on the via layer VIA, so that the first electrode RME1 and the second electrode RME2 may be arranged at the same plane.

The light emitting element ED disposed between the bank patterns BP1 and BP2 may emit light toward both ends, and the emitted light may be directed toward the electrodes RME disposed on the bank patterns BP1 and BP2. The electrodes RME may have a structure in which portions thereof disposed on the bank patterns BP1 and BP2 may reflect the light emitted from the light emitting element ED. The first electrode RME1 and the second electrode RME2 may be arranged to cover at least one side surfaces of the bank patterns BP1 and BP2 and may reflect the light emitted from the light emitting element ED.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2, so that the second power voltage may be applied to the second electrode RME2. However, the present disclosure is not limited thereto. In one or more embodiments, the electrodes RME1 and RME2 may not be electrically connected to the voltage lines VL1 and VL2 of the third conductive layer, respectively, and the connection electrode CNE to be described later may be directly connected to the third conductive layer.

The plurality of electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. Alternatively, the electrodes RME may have a structure in which a metal layer such as titanium (Ti), molybdenum (Mo), and niobium (Nb) and the alloy are stacked. In one or more embodiments, the electrodes RME may be formed as a double layer or a multilayer formed by stacking at least one metal layer made of an alloy including aluminum (Al) and titanium (Ti), molybdenum (Mo), and niobium (Nb).

The present disclosure is not limited thereto, and each electrode RME may further include a transparent conductive material. For example, each electrode RME may include a material such as ITO, IZO, and ITZO. In one or more embodiments, each of the electrodes RME may have a structure in which at least one transparent conductive material and at least one metal layer having high reflectivity are stacked, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the first substrate SUB.

The first insulating layer PAS1 may be disposed in the entire display area DPA and may be disposed on the via layer VIA and the plurality of electrodes RME. The first insulating layer PAS1 may include an insulating material to protect the plurality of electrodes RME and insulate electrodes RME that are different from each other. The first insulating layer PAS1 is disposed to cover the electrodes RME before the bank layer BNL is formed, so that it is possible to prevent the electrodes RME from being damaged in a process of forming the bank layer BNL. In addition, the first insulating layer PAS1 may prevent the light emitting element ED disposed thereon from being damaged by direct contact with other members.

In one or more embodiments, the first insulating layer PAS1 may have stepped portions such that the top surface thereof is partially depressed between the electrodes RME that are spaced in the second direction DR2. The light emitting element ED may be disposed on the top surface of the first insulating layer PAS1, where the stepped portions are formed, and thus a space may remain between the light emitting element ED and the first insulating layer PAS1.

In accordance with one or more embodiments, the first insulating layer PAS1 may include a plurality of separation openings OPR and the plurality of contact portions CT1 and CT2. The first insulating layer PAS1 may include the plurality of separation openings OPR formed to correspond to the separation portion ROP of the sub-region SA, and the plurality of contact portions CT1 and CT2 formed at the portion in which the connection electrode CNE to be described later and the electrode RME are connected. The first insulating layer PAS1 may be disposed on the entire via layer VIA, and may partially expose the layers disposed thereunder at the portions in which the plurality of separation openings OPR or the contact portions CT1 and CT2 are formed.

At the separation openings OPR formed to correspond to the separation portions ROP of the sub-regions SA, which are the openings formed in the first insulating layer PAS1, the process of separating the electrodes RME disposed thereunder may be performed. The plurality of electrodes RME may be disposed to extend in the first direction DR1, and may be separated into the plurality of electrodes RME by etching portions exposed by the separation openings OPR formed to correspond to the separation portions ROP among the openings of the first insulating layer PAS1.

The contact portions CT1 and CT2 formed in the first insulating layer PAS1 may be disposed to overlap different electrodes RME. For example, the contact portions CT1 and CT2 may be disposed in the sub-region SA, and may include the first contact portions CT1 disposed to overlap the first electrode RME1 and the second contact portions CT2 disposed in the sub-region SA to overlap the second electrode RME2. The first contact portions CT1 and the second contact portions CT2 may penetrate the first insulating layer PAS1 to partially expose the top surface of the first electrode RME1 or the second electrode RME2 thereunder. Each of the first contact portion CT1 and the second contact portion CT2 may further penetrate some of the other insulating layers disposed on the first insulating layer PAS1. The electrode RME exposed by each of the contact portions CT1 and CT2 may be in contact with the connection electrode CNE.

The bank layer BNL may be disposed on the first insulating layer PAS1. The bank layer BNL may include portions extending in the first direction DR1 and the second direction DR2, and may be around (or may surround) the sub-pixels SPXn. The bank layer BNL may surround and distinguish the emission area EMA and the sub-region SA of each sub-pixel SPXn, and may surround the outermost part of the display area DPA and distinguish the display area DPA and the non-display area NDA. The bank layer BNL is disposed in the entire display area DPA to form a grid pattern, and the regions exposed by the bank layer BNL in the display area DPA may be the emission area EMA and the sub-region SA.

Similarly to the bank patterns BP1 and BP2, the bank layer BNL may have a certain height. In one or more embodiments, the top surface of the bank layer BNL may be higher than that of the bank patterns BP1 and BP2, and the thickness of the bank layer BNL may be equal to or greater than that of the bank patterns BP1 and BP2. The bank layer BNL may prevent ink from overflowing to adjacent sub-pixels SPXn in an inkjet printing process during the manufacturing process of the display device 10. Similarly to the bank patterns BP1 and BP2, the bank layer BNL may include an organic insulating material such as polyimide.

The plurality of light emitting elements ED may be arranged in the emission area EMA. The light emitting elements ED may be disposed between the bank patterns BP1 and BP2, and may be arranged to be spaced from each other in the first direction DR1. In one or more embodiments, the plurality of light emitting elements ED may have a shape extending in one direction, and both ends thereof may be disposed on different electrodes RME. The length of the light emitting element ED may be greater than the gap between the electrodes RME spaced from each other in the second direction DR2. The extension direction of the light emitting elements ED may be substantially perpendicular to the first direction DR1 in which the electrodes RME extend. However, the present disclosure is not limited thereto, and the light emitting element ED may extend in the second direction DR2 or in a direction oblique to the second direction DR2.

The plurality of light emitting elements ED may be arranged on the first insulating layer PAS1. The light emitting element ED may have a shape extending in one direction, and may be disposed such that one direction in which the light emitting element ED extends is parallel to the top surface of the first substrate SUB. As will be described later, the light emitting element ED may include a plurality of semiconductor layers arranged along one direction in which the light emitting element ED extends, and the plurality of semiconductor layers may be sequentially arranged along the direction parallel to the top surface of the first substrate SUB. However, the present disclosure is not limited thereto, and the plurality of semiconductor layers may be arranged in the direction perpendicular to the first substrate SUB when the light emitting element ED has another structure.

The light emitting elements ED disposed in each sub-pixel SPXn may emit light of different wavelength bands depending on a material constituting the semiconductor layer. However, the present disclosure is not limited thereto, and the light emitting elements ED arranged in each sub-pixel SPXn may include the semiconductor layer of the same material and emit light of the same color.

The light emitting elements ED may be electrically connected to the electrode RME and the conductive layers below the via layer VIA while being in contact with the connection electrodes CNE (CNE1 and CNE2), and may emit light of a specific wavelength band by receiving an electrical signal.

The second insulating layer PAS2 may be disposed on the plurality of light emitting elements ED, the first insulating layer PAS1, and the bank layer BNL. The second insulating layer PAS2 may include a pattern portion disposed on the plurality of light emitting elements ED while extending in the first direction DR1 between the bank patterns BP1 and BP2. The pattern portion is disposed to partially surround the outer surface (e.g., outer peripheral or circumferential surface) of the light emitting element ED, and may not cover both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the first insulating layer PAS1 thereunder. Further, a part of the second insulating layer PAS2 may be disposed on the bank layer BNL and in the sub-regions SA.

In accordance with one or more embodiments, the second insulating layer PAS2 may include a plurality of openings OP1, OP2, OP3, and OPR and the plurality of contact portions CT1 and CT2. The second insulating layer PAS2 may include the plurality of separation openings OPR formed to correspond to the separation portion ROP of the sub-region SA, and the plurality of openings OP1 and OP2 disposed to partially overlap the electrode RME to expose the first ends and the second ends of the light emitting elements ED in the emission area EMA, and the openings OP3 disposed in an area other than the emission area EMA. The second insulating layer PAS2 may include the plurality of contact portions CT1 and CT2 formed at the portions in which the connection electrode CNE and the electrode RME are connected. The second insulating layer PAS2 may be disposed on the entire first insulating layer PAS1, and may partially expose the layers disposed thereunder at the portions in which the plurality of openings are formed.

At the separation openings OPR formed to correspond to the separation portions ROP of the sub-regions SA, which are the openings formed in the second insulating layer PAS2, the process of separating the electrodes RME disposed thereunder may be performed. Similarly to the first insulating layer PAS1, the second insulating layer PAS2 may include the separation opening OPR exposing the top surface of the via layer VIA at the separation portion ROP in which the process of separating the electrodes RME is performed.

The second insulating layer PAS2 may include first openings OP1 partially overlapping the first electrode RME1 and second openings OP2 partially overlapping the second electrode RME2. The first openings OP1 and the second openings OP2 may be disposed in the emission area EMA, and may expose both ends of the light emitting elements ED. The first openings OP1 may expose or may not cover the first ends of the light emitting elements ED that are disposed on the first electrodes RME1, and the second openings OP2 may expose or may not cover the second ends of the light emitting elements ED that are disposed on the second electrode RME2.

The plurality of first openings OP1 may be disposed to overlap one side of the first electrode RME1 that faces (e.g., opposes) the second electrode RME2, and may have a shape extending in the first direction DR1. The first opening OP1 may expose the first ends of the light emitting elements ED.

Similarly, the second openings OP2 may be disposed to overlap one side of the second electrode RME2 that faces (e.g., opposes) the first electrode RME1, and may have a shape extending in the first direction DR1. The second opening OP2 may expose the second ends of the light emitting elements ED. As will be described later, the first openings OP1 may also penetrate the third insulating layer PAS3 to be described later. The connection electrodes CNE may be in contact with both ends of the light emitting elements ED exposed through the plurality of first openings OP1 and the plurality of second openings OP2.

One first opening OP1 and one second opening OP2 may be disposed in one sub-pixel SPXn. However, the present disclosure is not limited thereto. In some embodiments, the plurality of first openings OP1 and the plurality of second openings OP2 may be disposed in one sub-pixel SPXn.

According to one or more embodiments, the second insulating layer PAS2 may include a third opening OP3 disposed in an area other than the emission area EMA. Unlike the openings OP1 and OP2 that partially overlap the electrodes RME, the third opening OP3 may be disposed not to overlap the electrodes RME. As an example, the third opening OP3 may have a shape extending in the first direction DR1 and may be disposed to overlap the bank layer BNL. The third opening OP3 may be disposed on a portion of the bank layer BNL extending in the first direction DR1 and may be disposed between the emission areas EMA of different sub-pixels SPXn. The third opening OP3 may be disposed to expose a part of the top surface of the bank layer BNL, and the third insulating layer PAS3 to be described later may be directly disposed on the exposed top surface of the bank layer BNL (e.g., see, FIG. 12).

The first opening OP1 and the second opening OP2 may be disposed in the emission area EMA in which the light emitting elements ED are disposed, and may partially overlap the light emitting elements ED. The first opening OP1 and the second opening OP2 may be disposed to expose a part of the light emitting element ED so that the connection electrodes CNE disposed on the second insulating layer PAS2 are able to be in contact with the light emitting element ED. Because the light emitting elements ED are disposed above the electrodes RME in the emission area EMA, the first and second openings OP1 and OP2 may be disposed to overlap the electrode RME and the light emitting element ED. On the other hand, the third opening OP3 may be formed in a portion where the light emitting elements ED are not disposed. The third opening OP3 may be disposed not to overlap the light emitting elements ED and the electrodes RME.

As shown in FIG. 12, the display device 10 according to one or more embodiments may further include electrodes BME, CSE1, and CSE2 overlapping the bank layer BNL among the conductive layers under the via layer VIA. For example, the first conductive layer may further include a lower electrode BME in addition to the lower metal layer BML. The second conductive layer may further include one electrode CSE1 of the storage capacitor, and the third conductive layer may further include the other electrode CSE2 of the storage capacitor. The lower electrode BME and both electrodes CSE1 and CSE2 of the storage capacitor may overlap, in the thickness direction (e.g., the third direction DR3), the bank layer BNL disposed between the emission areas EMA of the sub-pixels SPXn. The third opening OP3 of the second insulating layer PAS2 may overlap the lower electrode BME and both electrodes CSE1 and CSE2 of the storage capacitor in the thickness direction (e.g., the third direction DR3).

An alignment region in which the light emitting elements ED are disposed between the electrodes RME may be formed in the emission area EMA of each sub-pixel SPXn. During the manufacturing process of the display device 10, the light emitting elements ED may be sprayed to the emission area EMA to be disposed in the alignment region above the electrodes RME. However, some of the plurality of light emitting elements ED may also be sprayed to an area other than the emission area EMA, i.e., an area where the light emitting elements ED are not supposed to be aligned. For example, some of the light emitting elements ED sprayed to the emission area EMA may also be seated on the bank layer BNL, and these light emitting elements ED may remain as foreign substances in a subsequent process. According to one or more embodiments, the second insulating layer PAS2 may include the third opening OP3 that exposes a region other than the alignment region between the electrodes RME so that the light emitting elements ED remaining as foreign substances can be removed.

When the light emitting elements ED are disposed above the electrodes RME, a process of forming the second insulating layer PAS2 may be performed. After the second insulating layer PAS2 is entirely formed on the first insulating layer PAS1, a part thereof may be patterned to form the openings OP1, OP2, OP3, and OPR. The second insulating layer PAS2 may be disposed in the alignment region of the emission area EMA to fix the light emitting elements ED disposed above the electrodes RME. The second insulating layer PAS2 may be formed not to cover the light emitting elements ED disposed in a region other than the alignment region, so that the light emitting elements ED may be removed in a subsequent process.

The first opening OP1 and the second opening OP2 of the second insulating layer PAS2 may be disposed to expose both ends of the light emitting elements ED while penetrating the second insulating layer PAS2, and a patterned portion therebetween may fix the light emitting elements ED disposed in the alignment region. On the other hand, the third opening OP3 of the second insulating layer PAS2 may be formed in a region where the light emitting elements ED are not supposed to be aligned and may not cover the misaligned light emitting elements ED. After the second insulating layer PAS2 is formed, the light emitting elements ED seated in a region other than the alignment region may be removed, and the misaligned light emitting elements ED in each pixel PX may be prevented from remaining defective. For example, as the third opening OP3 of the second insulating layer PAS2 is disposed to overlap the bank layer BNL, the misaligned light emitting elements ED may not remain on the lower electrode BME under the bank layer BNL and both electrodes CSE1 and CSE2 of the storage capacitor. Accordingly, in a defect inspection performed after the manufacturing process of the display device 10 is completed, there is an advantage in that it is easy to inspect foreign substances or dark spots formed on both electrodes CSE1 and CSE2 of the storage capacitor.

The second insulating layer PAS2 may include the first contact portions CT1 disposed in the sub-region SA to overlap the first electrode RME1, and the second contact portions CT2 disposed in the sub-region SA to overlap the second electrode RME2. The contact portions CT1 and CT2 may penetrate the second insulating layer PAS2 in addition to the first insulating layer PAS1. The plurality of first contact portions CT1 and the plurality of second contact portions CT2 may partially expose the top surface of the first electrode RME1 or the second electrode RME2 disposed thereunder.

The plurality of connection electrodes CNE (CNE1 and CNE2) may be disposed on the plurality of electrodes RME and the bank patterns BP1 and BP2. The plurality of connection electrodes CNE may have a shape extending in one direction, and may be disposed to be spaced from each other. Each of the connection electrodes CNE may be in contact with the light emitting element ED, and may be electrically connected to the third conductive layer.

The plurality of connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first bank pattern BP1. The first connection electrode CNE1 may partially overlap the first electrode RME1 and may be disposed across the emission area EMA and the sub-region SA over the bank layer BNL. The second connection electrode CNE2 may have a shape extending in the first direction DR1 and may be disposed on the second electrode RME2 or the second bank pattern BP2. The second connection electrode CNE2 may partially overlap the second electrode RME2 and may be disposed across the emission area EMA and the sub-region SA over the bank layer BNL. Each of the first connection electrode CNE1 and the second connection electrode CNE2 may be in contact with the light emitting elements ED, and may be electrically connected to the electrodes RME or the conductive layer disposed thereunder.

For example, each of the first connection electrode CNE1 and the second connection electrode CNE2 may be disposed on the second insulating layer PAS2 and may be in contact with the light emitting elements ED. The first connection electrode CNE1 may partially overlap the first electrode RME1 and may be in contact with one ends of the light emitting elements ED. The second connection electrode CNE2 may partially overlap the second electrode RME2 and may be in contact with the other ends of the light emitting elements ED. The plurality of connection electrodes CNE are disposed across the emission area EMA and the sub-region SA. The connection electrodes CNE may be in contact with the light emitting elements ED at portions disposed in the emission area EMA, and may be electrically connected to the third conductive layer at portions disposed in the sub-region SA.

The first connection electrode CNE1 may be disposed to partially overlap the first opening OP1 of the second insulating layer PAS2. The second connection electrode CNE2 may be disposed to partially overlap the second opening OP2 of the second insulating layer PAS2. The first connection electrode CNE1 may be in contact with the first ends of the light emitting elements ED exposed through the first opening OP1, and the second connection electrode CNE2 may be in contact with the second ends of the light emitting elements ED exposed through the second opening OP2.

In accordance with one or more embodiments, in the display device 10, the connection electrodes CNE may be in contact with the electrode RME through the contact portions CT1 and CT2 disposed in the sub-region SA. The first connection electrode CNE1 may be in contract with the first electrode RME1 through the first contact portion CT1 penetrating the first insulating layer PAS1, the second insulating layer PAS2, and the third insulating layer PAS3 in the sub-region SA. The second connection electrode CNE2 may be in contact with the second electrode RME2 through the second contact portion CT2 penetrating the first insulating layer PAS1 and the second insulating layer PAS2 in the sub-region SA. Each of the connection electrodes CNE may be electrically connected to the third conductive layer through each of electrodes RME. The first connection electrode CNE1 may be electrically connected to the first transistor T1, so that the first power voltage may be applied to the first connection electrode CNE1, and the second connection electrode CNE2 may be electrically connected to the second voltage line VL2, so that the second power voltage may be applied to the second connection electrode CNE2. Each connection electrode CNE may be in contact the light emitting element ED in the emission area EMA to transmit the power voltage to the light emitting element ED.

However, the present disclosure is not limited thereto. In one or more embodiments, the plurality of connection electrodes CNE may be in direct contact with the third conductive layer, and may be electrically connected to the third conductive layer through patterns other than the electrodes RME.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

The third insulating layer PAS3 is disposed on the second connection electrode CNE2 and the second insulating layer PAS2 of the first connection electrode layer. The third insulating layer PAS3 may be disposed on the entire second insulating layer PAS2 to cover the second connection electrode CNE2, and the first connection electrode CNE1 of the second connection electrode layer may be disposed on the third insulating layer PAS3. The third insulating layer PAS3 may insulate the first connection electrode CNE1 and the second connection electrode CNE2 to prevent direct contact therebetween.

According to one or more embodiments, the third insulating layer PAS3 may include the first openings OP1 and the first contact portions CT1. The third insulating layer PAS3 may include the plurality of first openings OP1 disposed to partially overlap the electrode RME to expose the first ends of the light emitting elements ED, and the plurality of first contact portions CT1 formed in a region where the first connection electrode CNE1 and the first electrode RME1 are connected. The first opening OP1 may penetrate the second insulating layer PAS2 and the third insulating layer PAS3. The third insulating layer PAS3 may be disposed on the entire second insulating layer PAS2 and may partially expose the layers disposed thereunder at the portions in which the plurality of first openings OP1 are formed. The first connection electrode CNE1 may be disposed to partially overlap the first opening OP1 of the third insulating layer PAS3.

The first openings OP1 of the third insulating layer PAS3 may partially overlap the first electrode RME1 in the emission area EMA, and may expose or may not cover the first ends of the light emitting elements ED that are disposed on the first electrode RME1. The first openings OP1 may be disposed to overlap one side of the first electrode RME1 that faces (e.g., opposes) the second electrode RME2, and may have a shape extending in the first direction DR1.

The third insulating layer PAS3 may be disposed on the second opening OP2 and the third opening OP3 of the second insulating layer PAS2. Because the second connection electrode CNE2 is disposed in the second opening OP2 of the second insulating layer PAS2, the third insulating layer PAS3 may be disposed to cover the second connection electrode CNE2. A part of the top surface of the bank layer BNL may be exposed through the third opening OP3 of the second insulating layer PAS2, and the third insulating layer PAS3 may be in direct contact with a part of the top surface of the bank layer BNL.

The third insulating layer PAS3 may include the first contact portions CT1 disposed in the sub-region SA to overlap the first electrode RME1. The plurality of first contact portions CT1 may penetrate the third insulating layer PAS3 in addition to the first insulating layer PAS1 and the second insulating layer PAS2. The plurality of first contact portions CT1 may partially expose the top surface of the first electrode RME1 disposed thereunder.

In one or more embodiments another insulating layer may be further disposed on the third insulating layer PAS3 and the first connection electrode CNE1. The insulating layer may function to protect the members disposed on the first substrate SUB against the external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may include an inorganic insulating material. Alternatively, the first insulating layer PAS1 and the third insulating layer PAS3 may include an inorganic insulating material, whereas the second insulating layer PAS2 may include an organic insulating material. Each or at least one of the first insulating layer PAS1, the second insulating layer PAS2, and the third insulating layer PAS3 may have a structure in which a plurality of insulating layers are stacked alternately or repeatedly. In one or more embodiments, the first insulating layer PAS1, the second insulating layer PAS2, and the third insulating layer PAS3 may be any one of silicon oxide $(SiO_x)$, silicon nitride $(SiN_x)$, and silicon oxynitride $(SiO_xN_y)$. The first insulating layer PAS1, the second insulating layer PAS2, and the third insulating layer PAS3 may be made of the same material or different materials. Alternatively, some of them may be made of the same material and some of them may be made of different materials.

Figure 13:
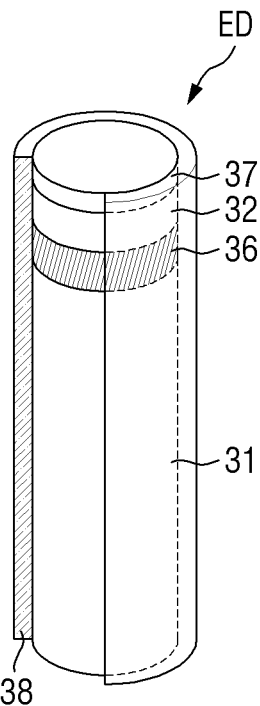
FIG. 13 is a schematic cutaway view of a light emitting element according to one or more embodiments.

FIG. 13 is a schematic cutaway view of a light emitting element according to one or more embodiments.

Referring to FIG. 13, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes facing each other.

The light emitting element ED according to one or more embodiments may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0\le x\le1$, $0\le y\le1$, $0\le x+y\le1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of AlxGayIn1-x-yN ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. A semiconductor layer disposed between the first semiconductor layer 31 and the light emitting layer 36 may be any one or more of AlGaInN, GaN, AlGaN, InGaN, AlN, InN and SLs doped with an n-type dopant, and a semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. For example, when the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other Group III to Group V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to be around (or to surround) the outer surfaces (e.g., the outer peripheral or circumferential surfaces) of the plurality of semiconductor layers and electrode layers described above. For example, the insulating film 38 may be disposed to be around (or to surround) at least the outer surface (e.g., the outer peripheral or circumferential surface) of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the present disclosure is not limited thereto. In one or more embodiments, the insulating film 38 may be formed in a multilayer structure having a plurality of layers stacked therein.

The insulating film 38 may perform a function of protecting the semiconductor layers and the electrode layer of the light emitting element ED. The insulating film 38 may prevent an electrical short circuit that is likely to occur at the light emitting layer 36 when an electrode to which an electrical signal is transmitted is in direct contact with the light emitting element ED. In addition, the insulating film 38 may prevent a decrease in luminous efficiency of the light emitting element ED.

Further, the insulating film 38 may have an outer surface (e.g., an outer peripheral or circumferential surface) that is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, other embodiments of the display device 10 will be described with reference to other drawings.

Figure 14:
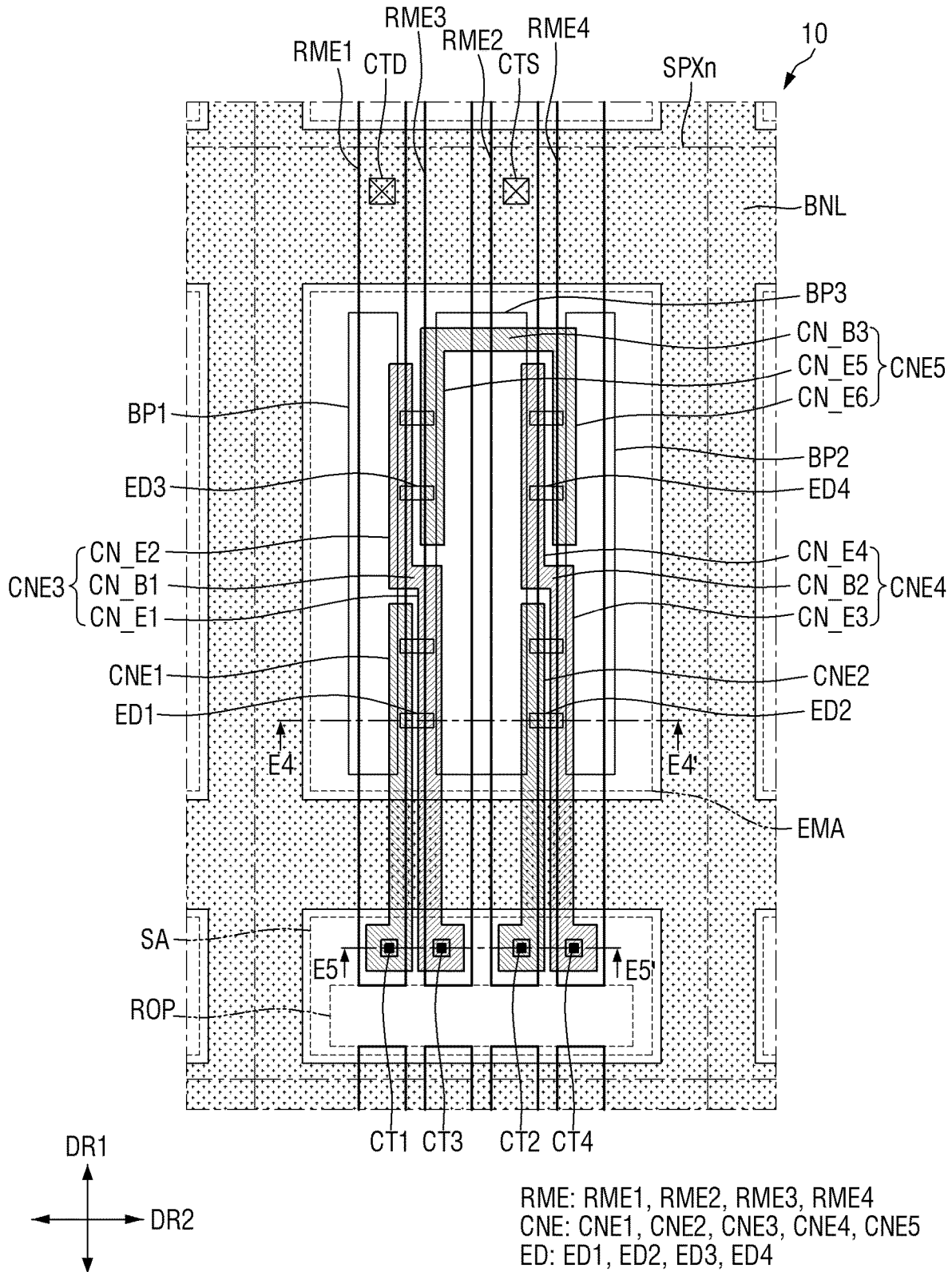
FIG. 14 is a plan view illustrating a sub-pixel of a display device according to one or more embodiments.

FIG. 14 is a plan view illustrating a sub-pixel of a display device according to one or more embodiments.

FIG. 14 illustrates planar arrangement of electrodes RME (RME1, RME2, RME3, and RME4), bank patterns BP1, BP2, and BP3, the bank layer BNL, the plurality of light emitting elements ED, connection electrodes CNE (CNE1, CNE2, CNE3, CNE4, and CNE5) disposed in one sub-pixel PXn of the display device 10.

Referring to FIG. 14, the display device 10 according to one or more embodiments may include a larger number of electrodes RME (RME1, RME2, RME3, and RME4), a larger number of bank patterns BP1, BP2, and BP3, a larger number of light emitting elements ED (ED1, ED2, ED3, and ED4), and a larger number of connection electrodes CNE (CNE1, CNE2, CNE3, CNE4, and CNE5). The display device 10 according to the described embodiment is different from the embodiment of FIG. 4 in that a larger number of electrodes and a larger number of light emitting elements are included in each sub-pixel SPXn. In the following description, redundant description will be omitted while focusing on differences.

Figure 15:
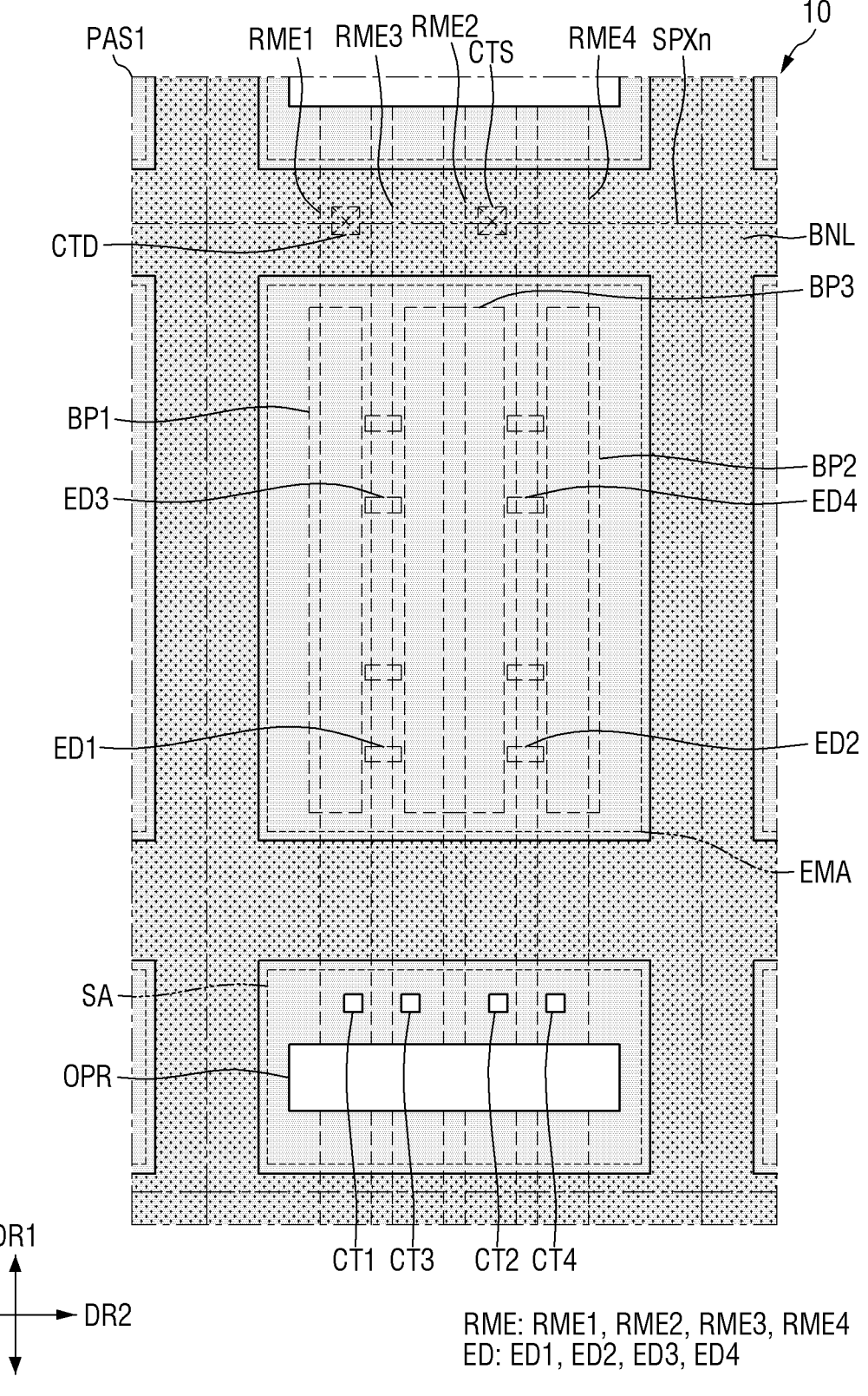
FIG. 15 is a plan view illustrating a first insulating layer disposed in one sub-pixel of FIG. 14.
Figure 16:
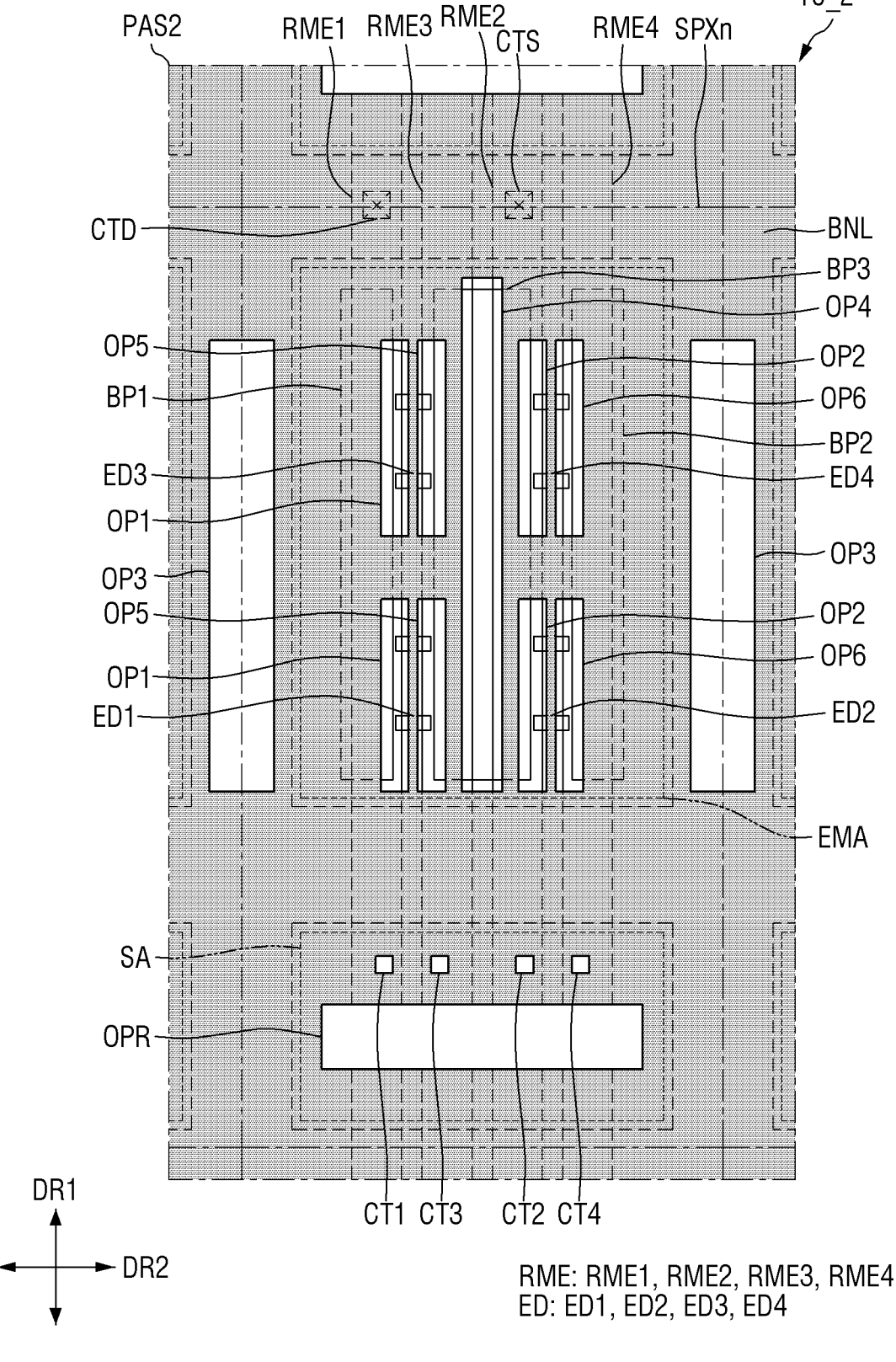
FIG. 16 is a plan view illustrating a second insulating layer disposed in one sub-pixel of FIG. 14.
Figure 17:
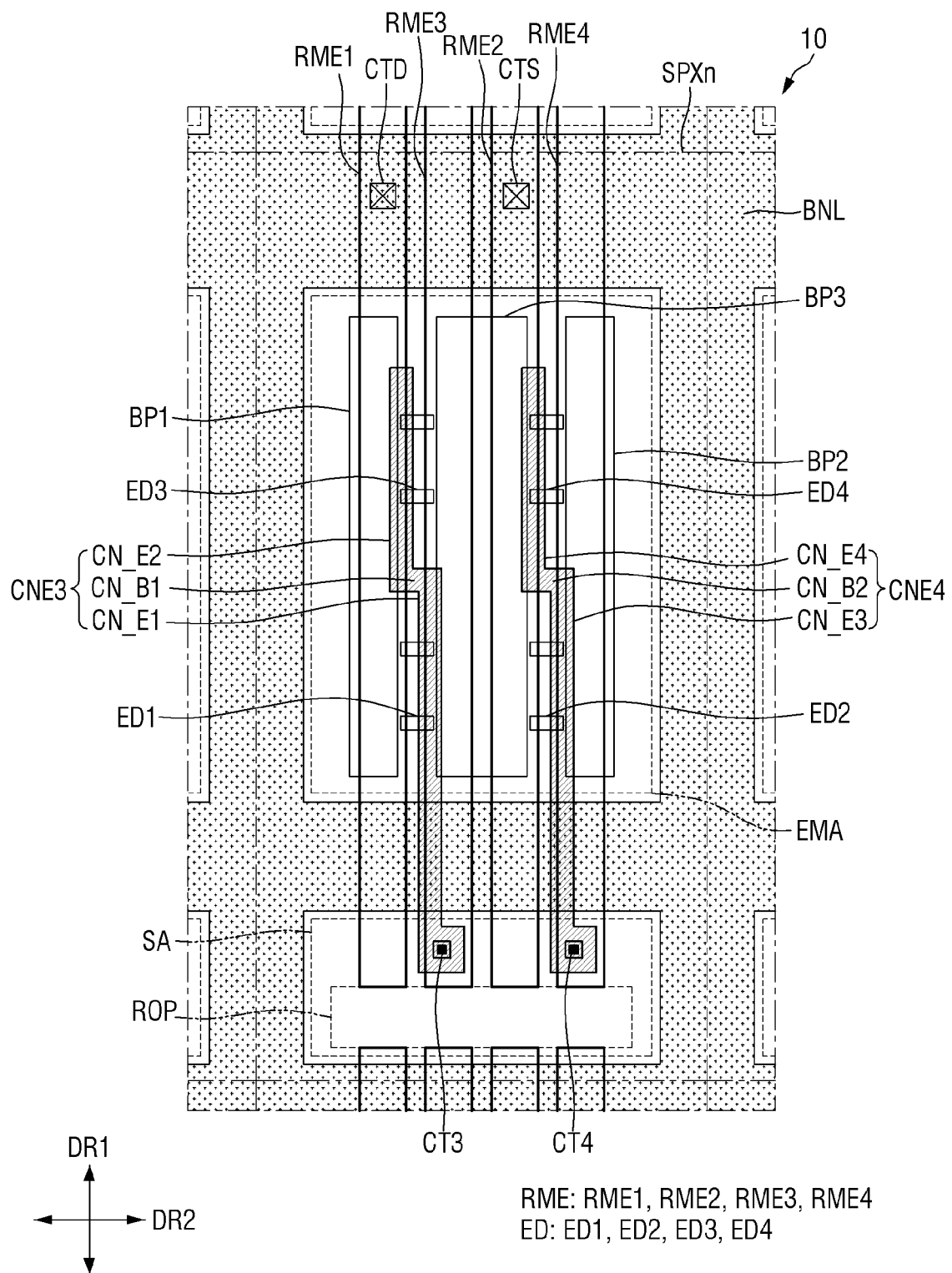
FIG. 17 is a plan view illustrating a first connection electrode layer disposed in one sub-pixel of FIG. 14.
Figure 18:
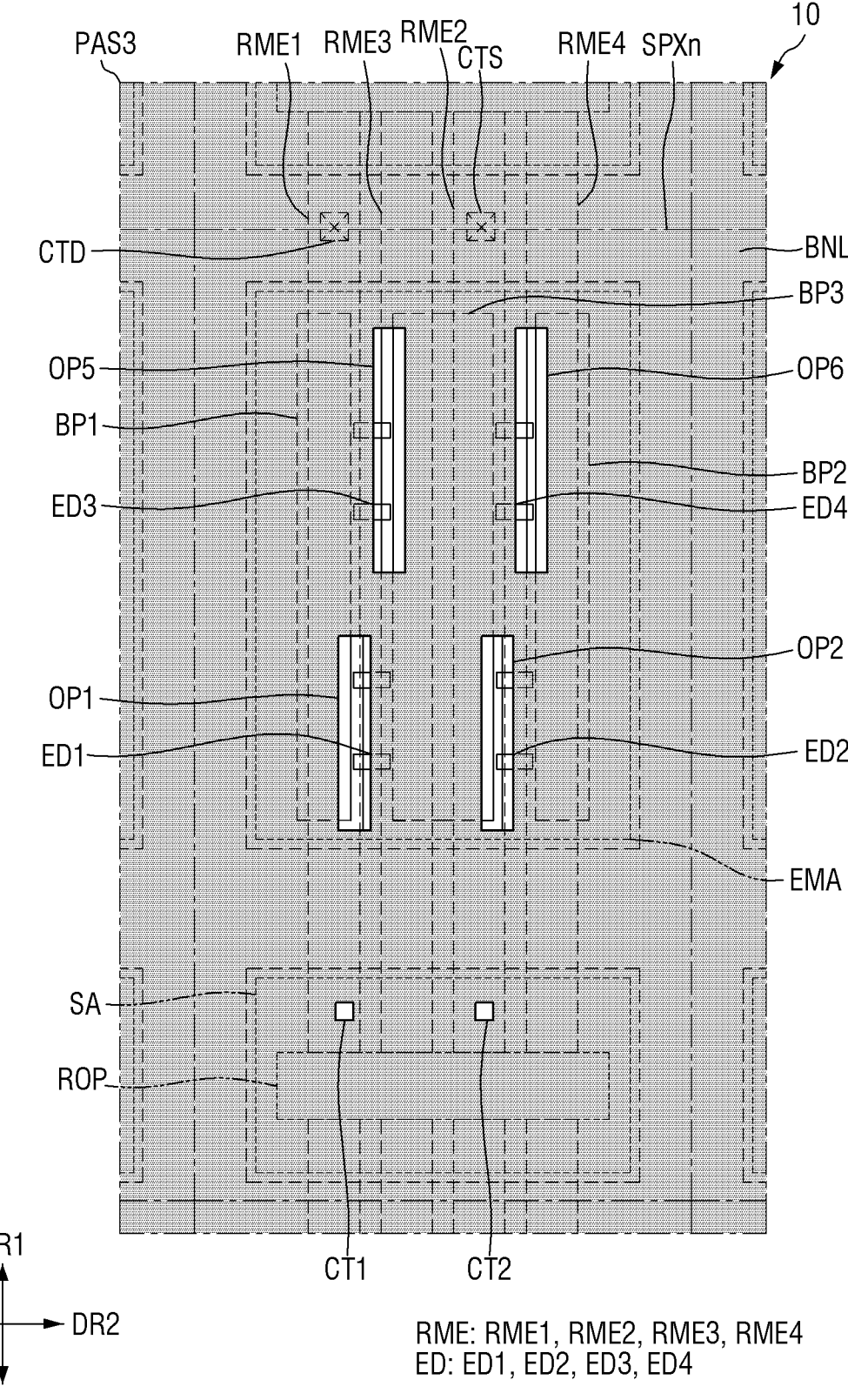
FIG. 18 is a plan view illustrating a third insulating layer disposed in one sub-pixel of FIG. 14.
Figure 19:
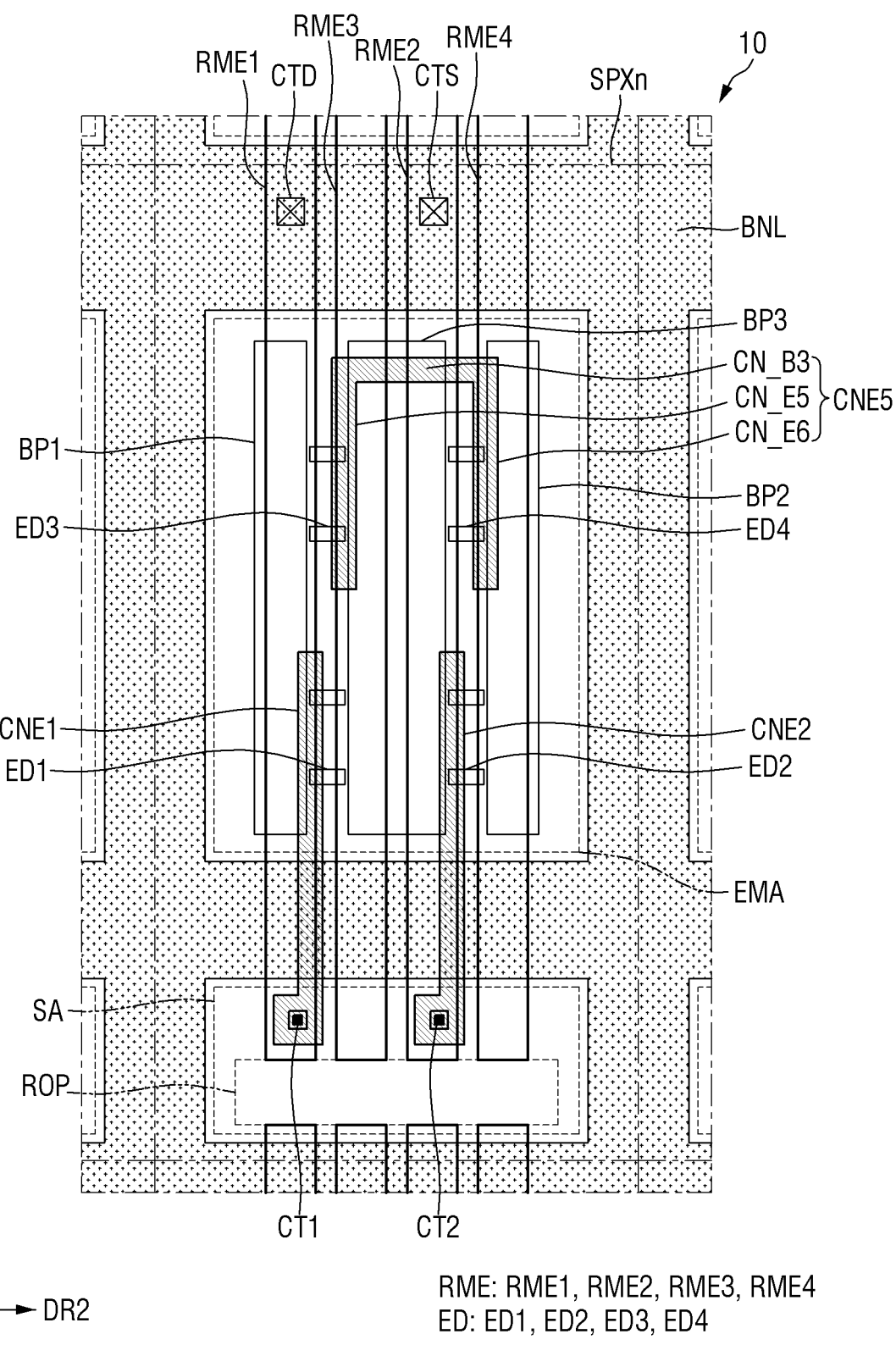
FIG. 19 is a plan view illustrating a second connection electrode layer disposed in one sub-pixel of FIG. 14.
Figure 20:
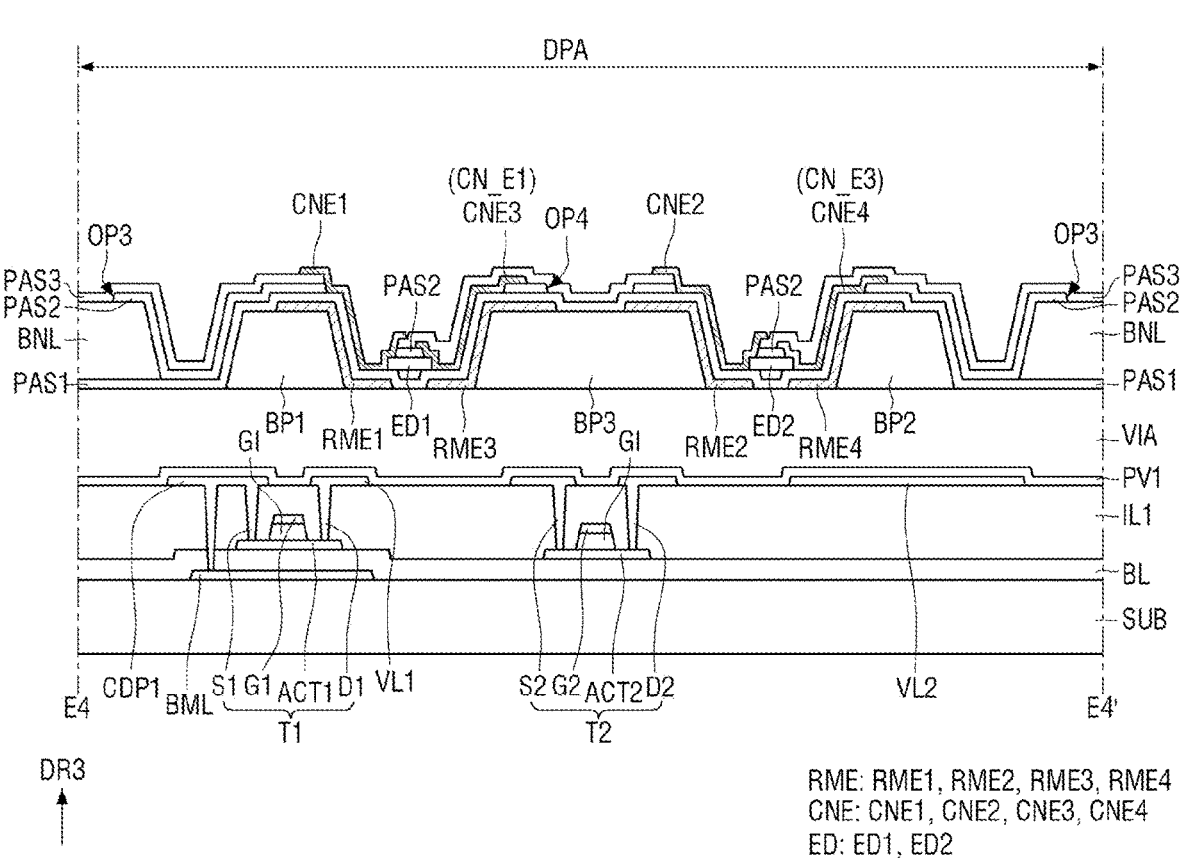
FIG. 20 is a cross-sectional view taken along the line E4-E4' in FIG. 14.
Figure 21:
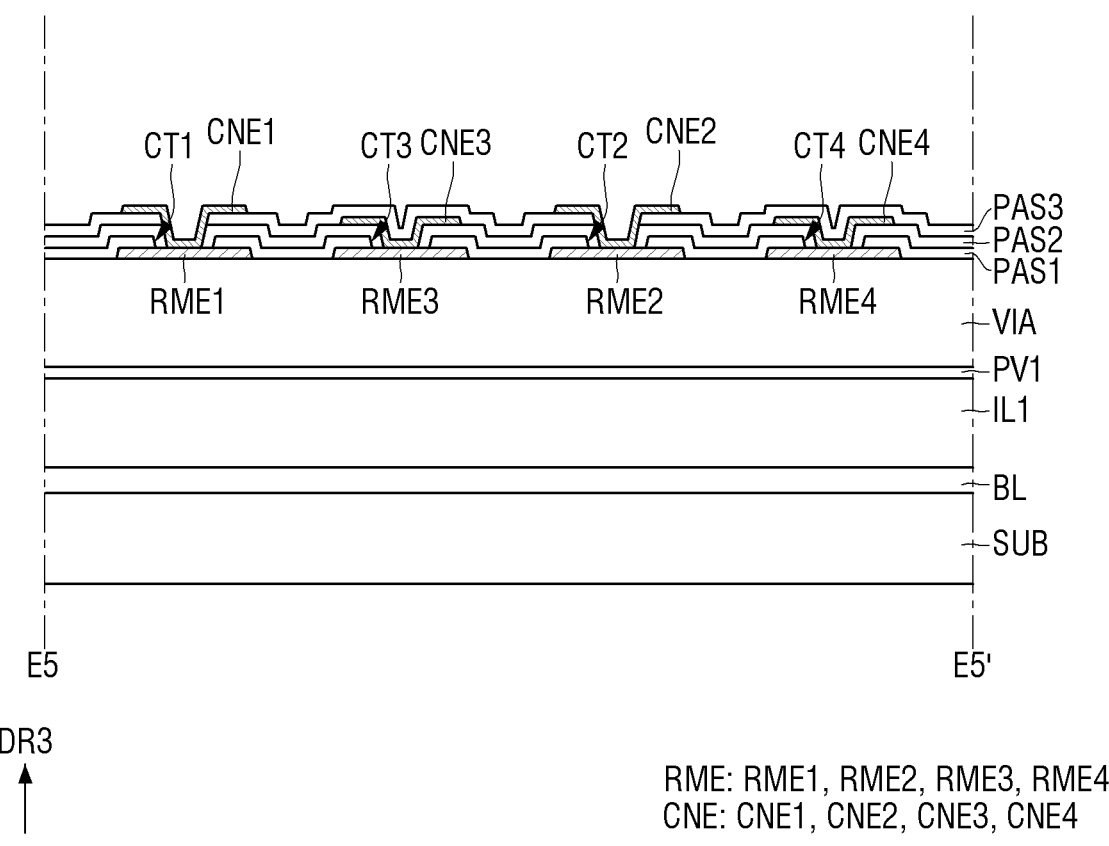
FIG. 21 is a cross-sectional view taken along the line E5-E5' of FIG. 14.

FIG. 15 is a plan view illustrating a first insulating layer disposed in one sub-pixel of FIG. 14. FIG. 16 is a plan view illustrating a second insulating layer disposed in one sub-pixel of FIG. 14. FIG. 17 is a plan view illustrating a first connection electrode layer disposed in one sub-pixel of FIG. 14. FIG. 18 is a plan view illustrating a third insulating layer disposed in one sub-pixel of FIG. 14. FIG. 19 is a plan view illustrating a second connection electrode layer disposed in one sub-pixel of FIG. 14. FIG. 20 is a cross-sectional view taken along the line E4-E4' in FIG. 14. FIG. 21 is a cross-sectional view taken along the line E5-E5' of FIG. 14.

FIGS. 15 to 19 illustrate the planar arrangement of a plurality of insulating layers PAS1, PAS2, and PAS3 that are different layers disposed in one pixel PX, and the connection electrodes CNE1, CNE2, CNE3, CNE4, and CNE5. FIG. 15 illustrates the planar arrangement of the first insulating layer PAS1 disposed under the bank layer BNL, and FIGS. 16 and 18 illustrate the planar arrangement of the second insulating layer PAS2 and the third insulating layer PAS3 disposed above the bank layer BNL. FIG. 20 illustrates a cross section across both ends of the first light emitting element ED1 and the second light emitting element ED2 disposed in one sub-pixel SPXn, and FIG. 21 illustrates a cross section across a plurality of contact portions CT1, CT2, CT3, and CT4 disposed in one sub-pixel SPXn.

Referring to FIGS. 15 to 21 in conjunction with FIG. 14, the bank patterns BP1, BP2, and BP3 may further include a third bank pattern BP3 disposed between the first bank pattern BP1 and the second bank pattern BP2. The first bank pattern BP1 may be located on the left side with respect to the center of the emission area EMA, the second bank pattern BP2 may be located on the right side with respect to the center of the emission area EMA, and the third bank pattern BP3 may be located at the center of the emission area EMA. The width of the third bank pattern BP3 measured in the second direction DR2 may be greater than those of the first bank pattern BP1 and the second bank pattern BP2 measured in the second direction DR2. The gap between the bank patterns BP1, BP2, and BP3 in the second direction DR2 may be greater than the gap between the electrodes RME. The first bank pattern BP1 may be disposed to partially overlap the first electrode RME1, and the second bank pattern BP2 may be disposed to partially overlap the fourth electrode RME4. The third bank pattern BP3 may be disposed to partially overlap the second electrode RME2 and the third electrode RME3. At least parts of the electrodes RME may be arranged without overlapping the bank patterns BP1, BP2, and BP3.

The plurality of electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced from the third electrode RME3 in the second direction DR2 with the second electrode RME2 interposed therebetween. The plurality of electrodes RME may be sequentially arranged in the order of the first electrode RME1, the third electrode RME3, the second electrode RME2, and the fourth electrode RME4 from the left side to the right side of the sub-pixel SPXn. The electrodes RME may face (or oppose) and may be spaced from each other in the second direction DR2. The plurality of electrodes RME may be spaced from the electrodes RME of another sub-pixel SPXn adjacent in the first direction DR1 at the separation portion ROP of the sub-region SA.

Among the plurality of electrodes RME, the first electrode RME1 and the second electrode RME2 may be in contact with the first conductive pattern CDP1 and the second voltage line VL2 disposed thereunder through the electrode contact holes CTD and CTS disposed under the bank layer BNL, respectively, whereas the third electrode RME3 and the fourth electrode RME4 may not be in contact with them.

The first insulating layer PAS1 may be disposed in a structure similar to that in the above-described embodiments. The first insulating layer PAS1 may be disposed in the entire display area DPA and may cover the plurality of electrodes RME and the bank patterns BP1, BP2, and BP3.

In accordance with one or more embodiments, the first insulating layer PAS1 may include the plurality of separation openings OPR and the plurality of contact portions CT1, CT2, CT3, and CT4. The separation opening OPR disposed to correspond to the separation portion ROP, which is the opening of the first insulating layer PAS1, is the same as that described above with reference to FIG. 5. The plurality of contact portions CT1, CT2, CT3, and CT4 formed in the first insulating layer PAS1 may be disposed to overlap different electrodes RME. For example, the plurality of contact portions CT1, CT2, CT3, and CT4 may be disposed in the sub-region SA, and may include the first contact portion CT1 disposed to overlap the first electrode RME1, the second contact portion CT2 disposed to overlap the second electrode RME2, the third contact portion CT3 disposed to overlap the third electrode RME3, and the fourth contact portion CT4 disposed to overlap the fourth electrode RME4. The plurality of contact portions CT1, CT2, CT3, and CT4 may penetrate the first insulating layer PAS1 to partially expose the top surfaces of the electrodes RME1, RME2, RME3, and RME4 disposed thereunder, respectively. Each of the contact portions CT1, CT2, CT3, and CT4 may further penetrate some of the other insulating layers disposed on the first insulating layer PAS1.

The plurality of light emitting elements ED may be arranged between the bank patterns BP1, BP2, and BP3 or on different electrodes RME. Some of the light emitting elements ED may be arranged between the first bank pattern BP1 and the third bank pattern BP3, and some other light emitting elements ED may be arranged between the third bank pattern BP3 and the second bank pattern BP2. In accordance with one or more embodiments, the light emitting element ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The second insulating layer PAS2 may be disposed in a structure similar to that of the above-described embodiment. The second insulating layer PAS2 may be disposed on the plurality of light emitting elements ED, the first insulating layer PAS1, and the bank layer BNL.

In accordance with one or more embodiments, the second insulating layer PAS2 may include a plurality of openings OP1, OP2, OP3, OP4, OP5, OP6, and OPR and the plurality of contact portions CT1, CT2, CT3, and CT4. The separation opening OPR formed to correspond to the separation portion ROP of the sub-region SA, which is the opening of the second insulating layer PAS2, is the same as that described above with reference to FIG. 6.

The second insulating layer PAS2 may include, in addition to the plurality of first openings OP1 partially overlapping the first electrode RME1 and the plurality of second openings OP2 partially overlapping the second electrode RME2, a plurality of fifth openings OP5 partially overlapping the third electrode RME3 and a plurality of sixth openings OP6 partially overlapping the fourth electrode RME4.

The first openings OP1 and the second openings OP2 may be disposed in the emission area EMA, and may expose both ends of the light emitting elements ED. The first openings OP1 may expose or may not cover the first ends of the light emitting elements ED that are disposed on the first electrode RME1, and the second openings OP2 may expose or may not cover the second ends of the light emitting elements ED that are disposed on the second electrode RME2.

The plurality of first openings OP1 may be disposed to overlap one side of the first electrode RME1 that faces (e.g., opposes) the third electrode RME3, and the plurality of first openings OP1 disposed in one sub-pixel SPXn may be disposed to be spaced from each other in the first direction DR1 in the emission area EMA of the corresponding sub-pixel SPXn. One first opening OP1 may expose the first ends of the first light emitting elements ED1, and another first opening OP1 may expose the first ends of the third light emitting elements ED3.

The plurality of second openings OP2 may be disposed to overlap one side of the second electrode RME2 that faces (e.g., opposes) the fourth electrode RME4, and the plurality of second openings OP2 disposed in one sub-pixel SPXn may be disposed to be spaced from each other in the first direction DR1 in the emission area EMA of the corresponding sub-pixel SPXn. One second opening OP2 may expose the first ends of the second light emitting elements ED2, and another second opening OP2 may expose the first ends of the fourth light emitting elements ED4.

Similarly, the plurality of fifth openings OP5 may be disposed to overlap one side of the third electrode RME3 that faces (e.g., opposes) the first electrode RME1, and the plurality of fifth openings OP5 disposed in one sub-pixel SPXn may be disposed to be spaced from each other in the first direction DR1 in the emission area EMA of the corresponding sub-pixel SPXn. One fifth opening OP5 may expose the second ends of the first light emitting elements ED1, and another fifth opening OP5 may expose the second ends of the third light emitting elements ED3.

The plurality of sixth openings OP6 may be disposed to overlap one side of the fourth electrode RME4 that faces (e.g., opposes) the second electrode RME2, and the plurality of sixth openings OP6 disposed in one sub-pixel SPXn may be disposed to be spaced from each other in the first direction DR1 in the emission area EMA of the corresponding sub-pixel SPXn. One sixth opening OP6 may expose the second ends of the second light emitting elements ED2, and another sixth opening OP6 may expose the second ends of the fourth light emitting elements ED4.

According to one or more embodiments, the second insulating layer PAS2 may include the third opening OP3 disposed in an area other than the emission area EMA, and a fourth opening OP4 disposed in the emission area EMA without overlapping the light emitting elements ED.

Unlike the openings OP1, OP2, OP5, and OP6 that partially overlap the electrodes RME, the third opening OP3 may be disposed not to overlap the electrodes RME. As an example, the third opening OP3 may have a shape extending in the first direction DR1 and may be disposed to overlap the bank layer BNL. The third opening OP3 may be disposed on a portion of the bank layer BNL extending in the first direction DR1 and may be disposed between the emission areas EMA of different sub-pixels SPXn adjacent in the second direction DR2. The third opening OP3 may be disposed to expose a part of the top surface of the bank layer BNL. The third opening OP3 may be formed in a portion where the light emitting elements ED are not disposed. The third opening OP3 may be disposed not to overlap the light emitting elements ED and the electrodes RME.

The fourth opening OP4 may be disposed to overlap the electrodes RME in the emission area EMA, and unlike the openings OP1, OP2, OP5, and OP6 that partially overlap the light emitting elements ED, may be disposed not to overlap the light emitting elements ED. As an example, the fourth opening OP4 may have a shape extending in the first direction DR1 and may be disposed on the third bank pattern BP3. The fourth opening OP4 may be disposed to partially overlap the second electrode RME2 and the third electrode RME3 while overlapping the third bank pattern BP3. The fourth opening OP4 may be disposed between the fifth openings OP5 and the second openings OP2 so as to be spaced from them in the second direction DR2. The fourth opening OP4 may be disposed to overlap a region between the second electrode RME2 and the third electrode RME3. One side of the second electrode RME2 and one side of the third electrode RME3 facing (or opposing) each other may overlap the fourth opening OP4.

In one or more embodiments, the lengths of the third opening OP3 and the fourth opening OP4 measured in the first direction DR1 may be greater than those of the first opening OP1, the second opening OP2, the fifth opening OP5, and the sixth opening OP6 measured in the first direction DR1. However, the present disclosure is not limited thereto.

The alignment region in which the light emitting elements ED are disposed between the electrodes RME may be formed in the emission area EMA of each sub-pixel SPXn. During the manufacturing process of the display device 10, the light emitting elements ED may be sprayed to the emission area EMA to be disposed in the alignment region above the electrodes RME. However, some of the plurality of light emitting elements ED may also be sprayed to an area other than the emission area EMA, i.e., an area where the light emitting elements ED are not supposed to be aligned.

For example, some of the light emitting elements ED sprayed to the emission area EMA may also be seated on the bank layer BNL, and these light emitting elements ED may remain as foreign substances in a subsequent process.

The second insulating layer PAS2 may include the third opening OP3 and the fourth opening OP4 that expose a region other than the alignment region between the electrodes RME so that the light emitting elements ED remaining as foreign substances can be removed. Similarly to the embodiment of FIG. 6, the third opening OP3 may be disposed on the bank layer BNL. The third opening OP3 may be disposed not to overlap the electrodes RME and the light emitting elements ED in an area other than the emission area EMA.

The fourth opening OP4 may be disposed in an area where the light emitting elements ED are not disposed in the emission area EMA. In one or more embodiments including four electrodes RME in each sub-pixel SPXn, the light emitting elements ED may be disposed above the first electrode RME1 and the third electrode RME3, and above the second electrode RME2 and the fourth electrode RME4, and may not be disposed above the second electrode RME2 and the third electrode RME3. The light emitting elements ED may be disposed between the first bank pattern BP1 and the third bank pattern BP3, and between the second bank pattern BP2 and the third bank pattern BP3, but may not be disposed on the third bank pattern BP3. The fourth opening OP4 may be disposed on the third bank pattern BP3 to induce the light emitting elements ED seated on the third bank pattern BP3 to be removed.

The plurality of contact portions CT1, CT2, CT3, and CT4 formed on the second insulating layer PAS2 may be disposed to overlap different electrodes RME. For example, the plurality of contact portions CT1, CT2, CT3, and CT4 may be disposed in the sub-region SA, and may include the first contact portion CT1 disposed to overlap the first electrode RME1, the second contact portion CT2 disposed to overlap the second electrode RME2, the third contact portion CT3 disposed to overlap the third electrode RME3, and the fourth contact portion CT4 disposed to overlap the fourth electrode RME4. The plurality of contact portions CT1, CT2, CT3, and CT4 may penetrate the second insulating layer PAS2 to partially expose the top surfaces of the electrodes RME1, RME2, RME3, and RME4 disposed thereunder, respectively. Some of the contact portions CT1, CT2, CT3, and CT4 may further penetrate another insulating layer disposed on the second insulating layer PAS2.

The plurality of connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged across the plurality of electrodes RME.

Unlike the embodiment of FIGS. 4 to 12, each of the first connection electrode CNE1 and the second connection electrode CNE2 may have a relatively short length extending in the first direction DR1. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn, and may be in direct contact with the electrode RME through the contact portions CT1 and CT2 formed in the sub-region SA, respectively. The first connection electrode CNE1 may be in direct contact with the first electrode RME1 through the first contact portion CT1 penetrating the first insulating layer PAS1, the second insulating layer PAS2, and the third insulating layer PAS3 in the sub-region SA, and the second connection electrode CNE2 may be in direct contact with the second electrode RME2 through the second contact portion CT2 penetrating the first insulating layer PAS1, the second insulating layer PAS2, and the third insulating layer PAS3 in the sub-region SA.

The third connection electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2. The first extension portion CN_E1 may be spaced from the first connection electrode CNE1 in the second direction DR2, and the second extension portion CN_E2 may be spaced from the first connection electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third connection electrode CNE3 may have a shape substantially extending in the first direction DR1, and may have a shape that is bent in the second direction DR2 and extends in the first direction DR1 again.

The fourth connection electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face (or oppose) and may be spaced from the second connection electrode CNE2 in the second direction DR2, and the fourth extension portion CN_E4 may be spaced from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1, and may have a shape that is bent in the second direction DR2 and extends in the first direction DR1 again.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face (or oppose) and may be spaced from the second extension portion CN_E2 of the third connection electrode CNE3 in the second direction DR2, and the sixth extension portion CN_E6 may face (or oppose) and may be spaced from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to be around (or to surround) the fourth extension portion CN_E4 of the fourth connection electrode CNE4 in a plan view.

The third connection electrode CNE3 may be in direct contact with the third electrode RME3 through the third contact portion CT3 penetrating the first insulating layer PAS1 and the second insulating layer PAS2 in the sub-region SA, and the fourth connection electrode CNE4 may be in direct contact with the fourth electrode RME4 through the fourth contact portion CT4 penetrating the first insulating layer PAS1 and the second insulating layer PAS2 in the sub-region SA.

However, the present disclosure is not limited thereto. In one or more embodiments, in the display device 10, some of the connection electrodes CNE may be directly connected to the third conductive layer. For example, the first connection electrode CNE1 and the second connection electrode CNE2 that are first type connection electrodes may be directly connected to the third conductive layer and may be electrically connected to the electrode RME. A second type connection electrode and a third type connection electrode may not be electrically connected to the electrode RME, and may be connected only to the light emitting elements ED. In one or more embodiments, the second type connection electrode may be electrically connected to the electrodes RME.

The first connection electrode CNE1 and the second connection electrode CNE2 may be the first type connection electrodes connected to the electrodes RME1 and RME2 directly connected to the third conductive layer, respectively. The third connection electrode CNE3 and the fourth connection electrode CNE4 may be the second type connection electrodes connected to the electrodes RME3 and RME4 that are not connected to the third conductive layer. The fifth connection electrode CNE5 may be the third type connection electrode that is not connected to the electrode RME. The fifth connection electrode CNE5 may be in contact with the light emitting elements ED without being connected to the electrode RME and may constitute an electrical connection circuit of the light emitting elements ED together with other connection electrodes CNE.

In one or more embodiments, the third connection electrode CNE3 and the fourth connection electrode CNE4 that are the second type connection electrodes may be connection electrodes in which electrode extension portions extending in the first direction DR1 are not parallel to each other in the second direction DR2. The fifth connection electrode CNE5 that is the third type connection electrode may be the connection electrode in which electrode extension portions extending in the first direction DR1 are parallel to each other in the second direction DR2. The third connection electrode CNE3 and the fourth connection electrode CNE4 may have a shape that is bent while extending in the first direction DR1, and the fifth connection electrode CNE5 may have a shape surrounding a part of another connection electrode.

The third insulating layer PAS3 may be disposed in a structure similar to that of the above-described embodiment. The third insulating layer PAS3 may be disposed on the second insulating layer PAS2 except the region in which the second connection electrode layer is disposed.

In accordance with one or more embodiments, the third insulating layer PAS3 may include a plurality of openings OP1, OP2, OP5, OP6, and OPR and the plurality of contact portions CT1 and CT2. The plurality of openings may include the first opening OP1 that partially overlaps the first electrode RME1, the second opening OP2 that partially overlaps the second electrode RME2, the fifth opening OP5 that partially overlaps the third electrode RME3, and the sixth opening OP6 that partially overlaps the fourth electrode RME4.

The first opening OP1 may be disposed to overlap one side of the first electrode RME1 that faces (e.g., opposes) the third electrode RME3. The first opening OP1 disposed in one sub-pixel SPXn may expose the first ends of the first light emitting elements ED1. The second opening OP2 may be disposed to overlap one side of the second electrode RME2 that faces (e.g., opposes) the fourth electrode RME4. The second opening OP2 disposed in one sub-pixel SPXn may expose the second ends of the second light emitting elements ED2.

The fifth opening OP5 may be disposed to overlap one side of the third electrode RME3 that faces (e.g., opposes) the first electrode RME1. The fifth opening OP5 disposed in one sub-pixel SPXn may expose the second ends of the third light emitting elements ED3. The sixth opening OP6 may be disposed to overlap one side of the fourth electrode RME4 that faces (e.g., opposes) the second electrode RME2. The sixth opening OP6 disposed in one sub-pixel SPXn may expose the first ends of the fourth light emitting elements ED4.

The third insulating layer PAS3 may be disposed on any one of the plurality of first openings OP1, second openings OP2, fifth openings OP5, and sixth openings OP6 of the second insulating layer PAS2. The third connection electrode CNE3 and the fourth connection electrode CNE4 may be disposed in any one of the plurality of first openings OP1, second openings OP2, fifth openings OP5, and sixth openings OP6 of second insulating layer PAS2. The third insulating layer PAS3 may be disposed to cover the third connection electrode CNE3 and the fourth connection electrode CNE4.

The third insulating layer PAS3 may be disposed on the third opening OP3 and the fourth opening OP4 of the second insulating layer PAS2. The third opening OP3 and the fourth opening OP4 of the second insulating layer PAS2 are formed to expose the first insulating layer PAS1 or the bank layer BNL therebelow so that the misaligned light emitting elements ED are removed. The third insulating layer PAS3 may cover a lower layer exposed through the third opening OP3 and the fourth opening OP4. The third insulating layer PAS3 may be in direct contact with a part of the top surface of the bank layer BNL in the third opening OP3, and may be in direct contact with a part of the top surface of the first insulating layer PAS1 in the fourth opening OP4.

The plurality of contact portions CT1 and CT2 formed in the third insulating layer PAS3 may be disposed to overlap different electrodes RME, respectively. For example, the third insulating layer PAS3 may include the first contact portion CT1 disposed to overlap the first electrode RME1, and the second contact portion CT2 disposed to overlap the second electrode RME2. The first contact portion CT1 and the second contact portion CT2 may penetrate the first insulating layer PAS1, the second insulating layer PAS2, and the third insulating layer PAS3 to expose a part of the top surfaces of the first electrode RME1 and the second electrode RME2 therebelow.

The first connection electrode CNE1 may be disposed to partially overlap the first opening OP1 disposed at a lower region of the emission area EMA. The second connection electrode CNE2 may be disposed to partially overlap the second opening OP2 disposed at a lower region of the emission area EMA. The third connection electrode CNE3 may be disposed to partially overlap the fifth opening OP5 disposed at a lower region of the emission area EMA and the first opening OP1 disposed at an upper region of the emission area EMA. The fourth connection electrode CNE4 may be disposed to partially overlap the sixth opening OP6 disposed at a lower region of the emission area EMA and the second opening OP2 disposed at an upper region of the emission area EMA. The fifth connection electrode CNE5 may be disposed to partially overlap the fifth opening OP5 disposed at a upper region of the emission area EMA and the sixth opening OP6 disposed at an upper region of the emission area EMA.

The first connection electrode CNE1 may be in contact with the first end of the first light emitting element ED1 exposed through the first opening OP1, and the second connection electrode CNE2 may be in contact with the second end of the second light emitting element ED2 exposed through the second opening OP2. The third connection electrode CNE3 may be in contact with the second end of the first light emitting element ED1 exposed through the fifth opening OP5, and the first end of the third light emitting element ED3 exposed through the first opening OP1. The fourth connection electrode CNE4 may be in contact with the second end of the fourth light emitting element ED4 exposed through the second opening OP2, and the first end of the second light emitting element ED2 exposed through the sixth opening OP6. The fifth connection electrode CNE5 may be in contact with the second end of the third light emitting element ED3 exposed through the fifth opening OP5, and the first end of the fourth light emitting element ED4 exposed through the sixth opening OP6.

The plurality of light emitting elements ED may be classified into different light emitting elements ED depending on the connection electrodes CNE to be in contact with both ends of the light emitting elements ED to correspond to the arrangement structure of the connection electrodes CNE. The first light emitting element ED1 and the second light emitting element ED2 may have first ends in contact with the first type connection electrodes and second ends in contact with the second type connection electrodes. The first light emitting element ED1 may be in contact with the first connection electrode CNE1 and the third connection electrode CNE3, and the second light emitting element ED2 may be in contact with the second connection electrode CNE2 and the second connection electrode CNE4. The third light emitting element ED3 and the fourth light emitting element ED4 may have first ends in contact with the second type connection electrodes and second ends in contact with the third type connection electrodes. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

The plurality of light emitting elements ED may be connected in series through the plurality of connection electrodes CNE. Because the display device 10 according to the described embodiment includes a larger number of light emitting elements ED for each sub-pixel SPXn and the light emitting elements ED are connected in series, the light emission amount per unit area may be further increased.

Figure 22:
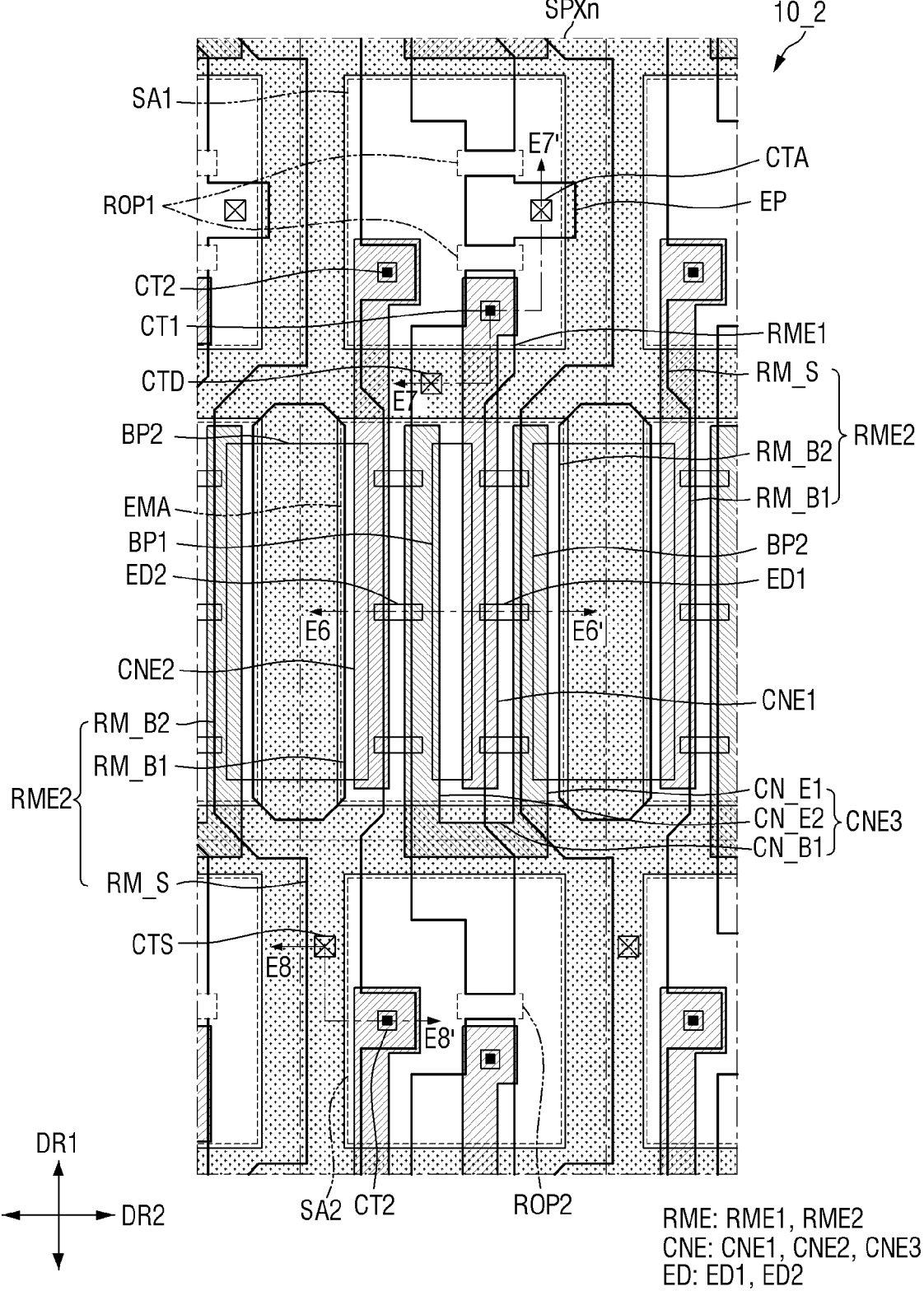
FIG. 22 is a plan view illustrating a sub-pixel of a display device according to one or more embodiments.
Figure 23:
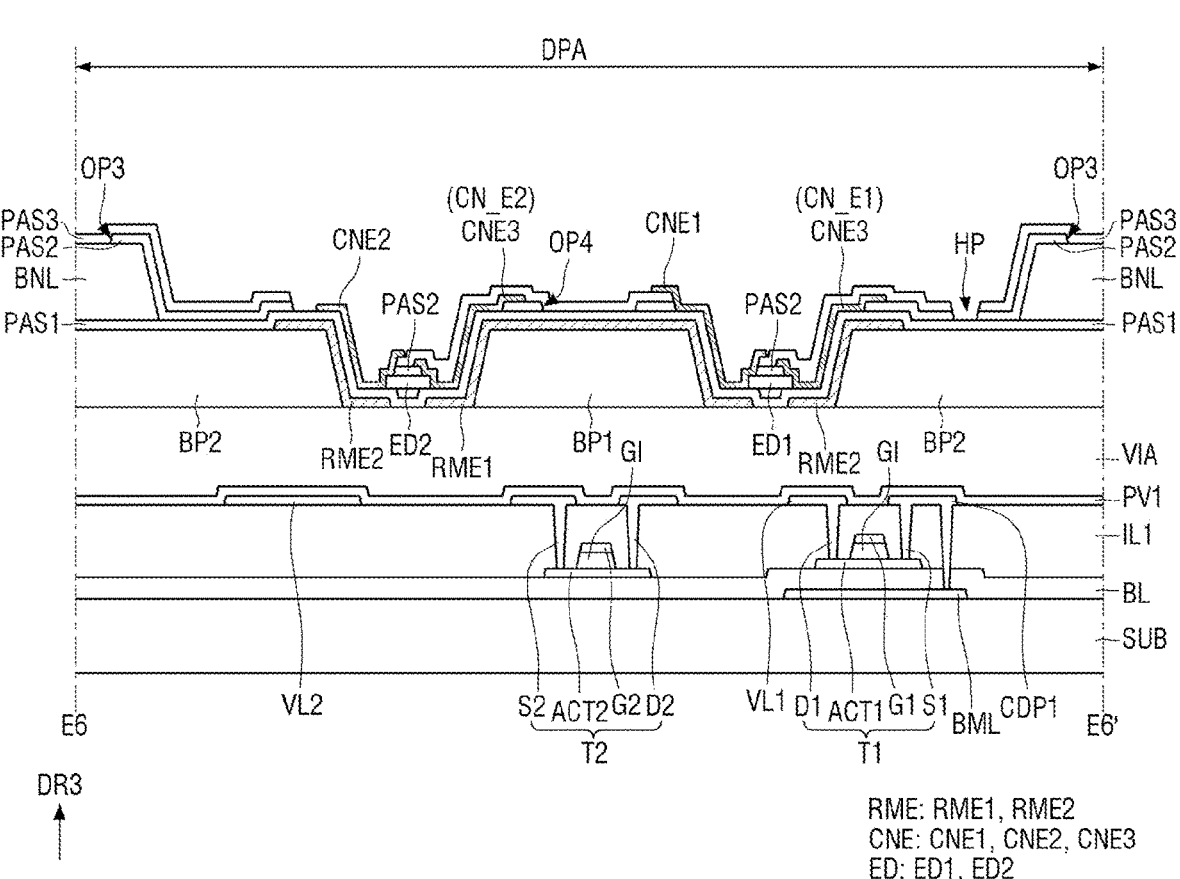
FIG. 23 is a cross-sectional view taken along the line E6-E6' of FIG. 22.

FIG. 22 is a plan view illustrating a sub-pixel of a display device according to one or more embodiments. FIG. 23 is a cross-sectional view taken along the line E6-E6' of FIG. 22.

Figure 24:
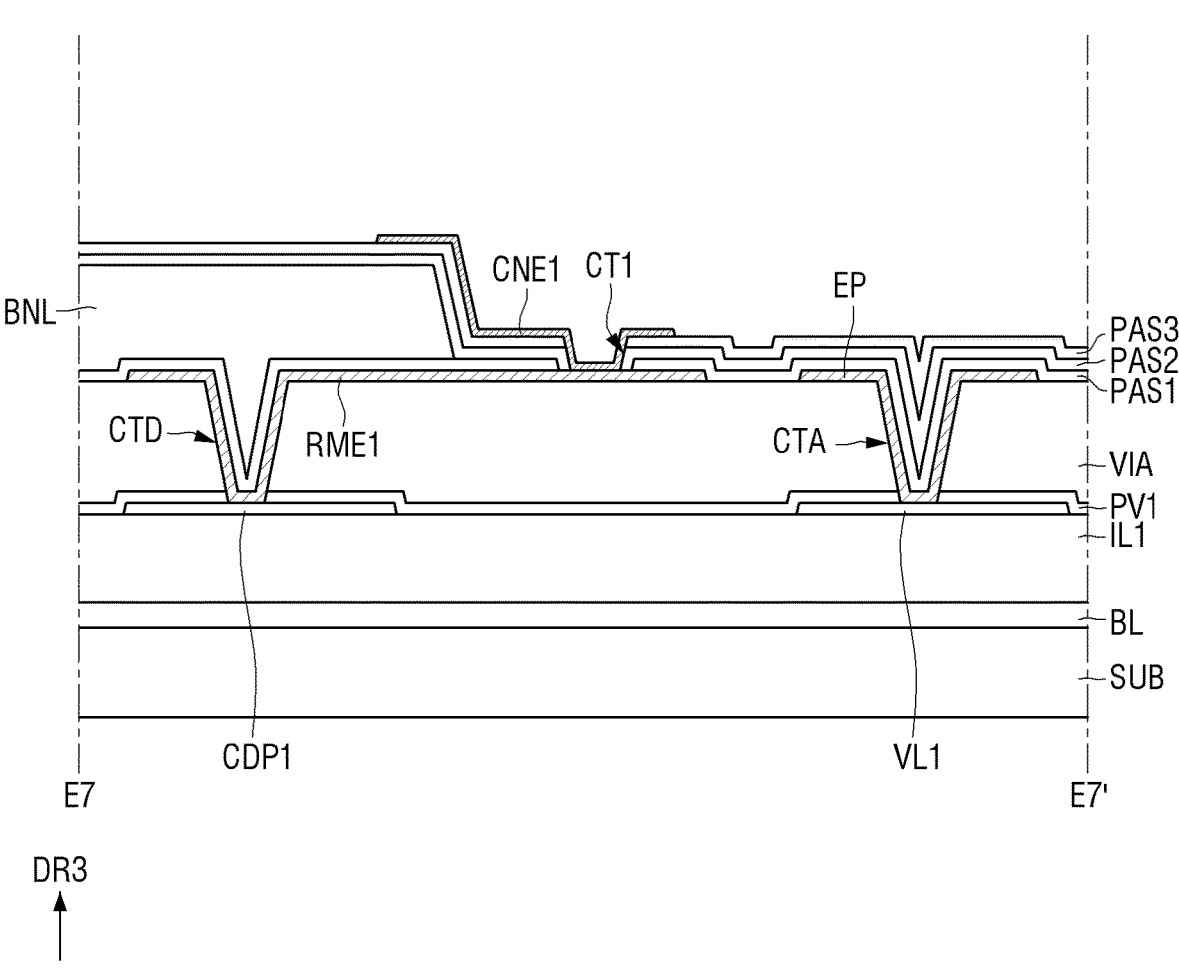
FIG. 24 is a cross-sectional view taken along the line E7-E7' in FIG. 22.
Figure 25:
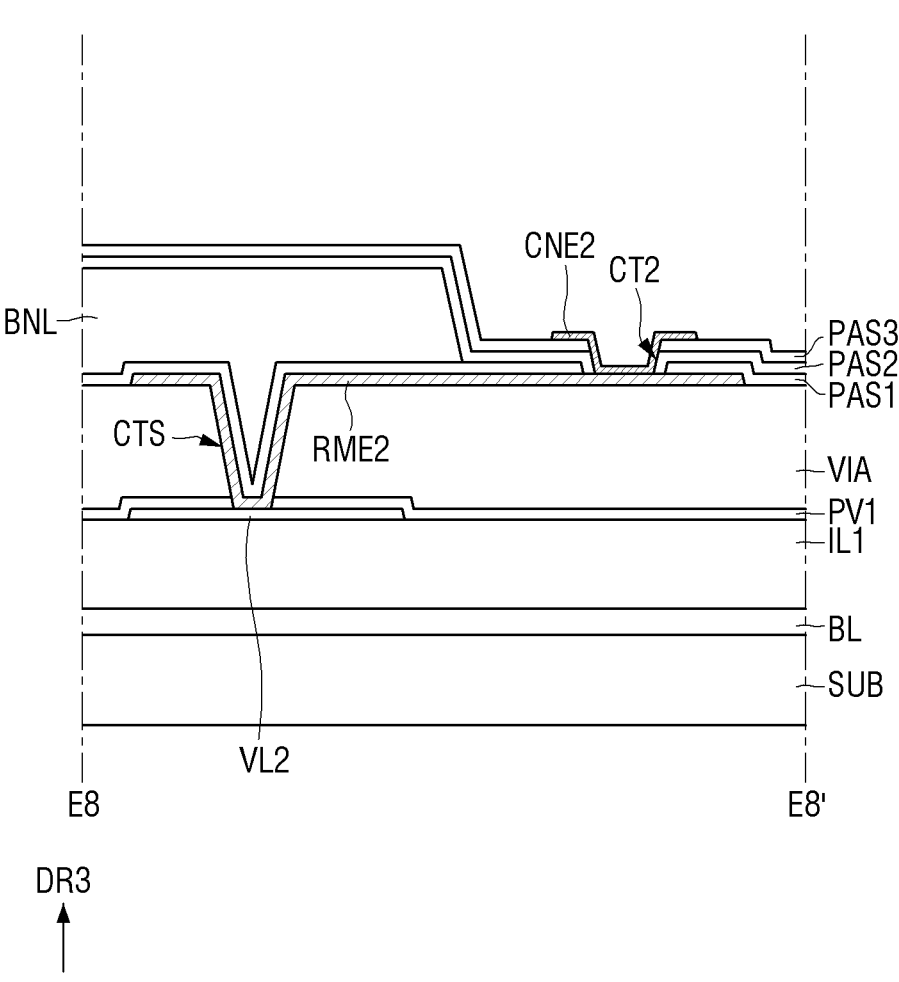
FIG. 25 is a cross-sectional view taken along the line E8-E8' in FIG. 22.

FIG. 24 is a cross-sectional view taken along the line E7-E7' in FIG. 22. FIG. 25 is a cross-sectional view taken along the line E8-E8' in FIG. 22.

FIG. 22 illustrates planar arrangement of the electrodes RME (RME1 and RME2), the bank patterns BP1 and BP2, the bank layer BNL, the plurality of light emitting elements ED, and the connection electrodes CNE (CNE1, CNE2, and CNE3) disposed in one pixel PX of the display device 10. FIG. 23 illustrates a cross section across both ends of the light emitting elements ED (ED1 and ED2) disposed on different electrodes RME. FIGS. 24 and 25 illustrate cross sections across a plurality of electrode contact holes CTD, CTS, and CTA, and the contact portions CT1 and CT2.

Referring to FIGS. 22 to 25, in the display device 10 according to one or more embodiments, the structures of the electrode RME, the connection electrode CNE, and the bank patterns BP1 and BP2 may be different from those in the above-described embodiments. Hereinafter, the redundant description of the above-described embodiments will be omitted while focusing on differences.

The plurality of bank patterns BP1 and BP2 may have a shape extending in the first direction DR1, and may have different widths measured in the second direction DR2. Any one of the bank patterns BP1 and BP2 may be disposed across the sub-pixels SPXn adjacent in the second direction DR2. For example, the bank patterns BP1 and BP2 may include the first bank pattern BP1 disposed in the emission area EMA of each sub-pixel SPXn and the second bank pattern BP2 disposed across the emission areas EMA of different sub-pixels SPXn adjacent in the second direction DR2.

The first bank pattern BP1 is disposed in the center of the emission areas EMA, and the second bank patterns BP2 are disposed to be spaced apart from the first bank pattern BP1 interposed therebetween. The first bank pattern BP1 and the second bank pattern BP2 may be alternately disposed along the second direction DR2. The light emitting elements ED may be disposed between the first bank pattern BP1 and the second bank pattern BP2 that are spaced from each other.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction (e.g., the third direction DR3). The first bank pattern BP1 may be disposed to overlap the first electrode RME1, and the second bank pattern BP2 may be disposed to overlap electrode branch portions RM_B1 and RM_B2 of the second electrode RME2 and the bank layer BNL.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction (e.g., the third direction DR3). The bank patterns BP1 and BP2 may be disposed in an island-like pattern on the entire surface of the display area DPA.

The plurality of electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center of the sub-pixel SPXn, and the portion of the first electrode RME1 disposed in the emission area EMA may be disposed on the first bank pattern BP1. The first electrode RME1 may extend from the sub-region SA in the first direction DR1 to the sub-region SA of another sub-pixel SPXn. The first electrode RME1 may have a shape in which the width measured in the second direction DR2 changes depending on positions, and at least a portion of the first electrode RME1 overlapping the first bank pattern BP1 in the emission area EMA may have a width greater than that of the first bank pattern BP1.

The second electrode RME2 may include a portion extending in the first direction DR1 and portions branched near the emission area EMA. In one or more embodiments, the second electrode RME2 may include an electrode stem portion RM_S extending in the first direction DR1, the plurality of electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1, and may be disposed at one side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL in the second direction DR2, and may be bent toward both sides in the second direction DR2. The electrode branch portions RM_B1 and RM_B2 may be disposed across the emission area EMA in the first direction DR1, and may be bent again to be integrally connected to the electrode stem portion RM_S. That is, the electrode branch portions RM_B1 and RM_B2 of the second electrode RME2 may be branched on the upper side of the emission area EMA of any one sub-pixel SPXn, and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in one sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap one side of the second bank pattern BP2. The first electrode branch portion RM_B1 may partially overlap the second bank pattern BP2 disposed on the left side of the first bank pattern BP1, and the second electrode branch portion RM_B2 may partially overlap the second bank pattern BP2 disposed on the right side of the first bank pattern BP1. Both sides of the first electrode RME1 may face (or oppose) and may be spaced from different electrode branch portions RM_B1 and RM_B2 of different second electrodes RME2, and the gap between the first electrode RME1 and each of the electrode branch portions RM_B1 and RM_B2 may be smaller than the gap between different bank patterns BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may have a width greater than that of the first bank pattern BP1 and overlap both sides of the first bank pattern BP1, whereas the second electrode RME2 may have a relatively small width so that the electrode branch portions RM_B1 and RM_B2 may overlap only one side of the second bank pattern BP2.

The first electrode RME1 may be in contact with the first conductive pattern CDP1 of the third conductive layer through the first electrode contact hole CTD at the portion overlapping the portion of the bank layer BNL extending in the second direction DR2. The second electrode RME2 may be in contact with the second voltage line VL2 of the third conductive layer through the second electrode contact hole CTS at the electrode stem portion RM_S. The portion of the first electrode RME1 disposed in the sub-region SA may be disposed to overlap the first contact portion CT1. The second electrode RME2 may have a portion that protrudes from the electrode stem portion RM_S in the second direction DR2 to be disposed in the sub-region SA, and the second electrode RME2 may overlap the second contact portion CT2 at the protruding part.

Between the first electrode RME1 and the second electrode RME2, the first electrode RME1 may extend to separation portions ROP1 and ROP2 of the sub-region SA, whereas the second electrode RME2 may not be separated in the sub-region SA. One second electrode RME2 may include a plurality of electrode stem portions RM_S and the electrode branch portions RM_B1 and RM_B2, and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with one or more embodiments, the display device 10 may include a wire connection electrode EP disposed between the first electrodes RME1 of different sub-pixels SPXn in the first sub-region SA1 among the plurality of sub-regions SA1 and SA2 of each sub-pixel SPXn. The wire connection electrode EP may not be disposed in the second sub-region SA of the sub-pixel SPXn, and the first electrodes RME1 of different sub-pixels SPXn adjacent in the first direction DR1 may be spaced from each other. In the sub-pixel SPXn illustrated in FIG. 22 among the plurality of sub-pixels SPXn, the first sub-region SA1 in which the wire connection electrode EP is disposed may be disposed on the upper side of the emission area EMA, and the second sub-region SA2 may be disposed on the lower side of the emission area EMA. On the other hand, in the sub-pixel SPXn adjacent to the sub-pixel SPXn of FIG. 22 in the first direction DR1, the first sub-region SA1 in which the wire connection electrode EP is disposed may be disposed on the lower side of the emission area EMA, and the second sub-region SA2 may be disposed on the upper side of the emission area EMA.

The first electrode RME1 may be spaced from the wire connection electrode EP with the first separation part ROP1 interposed therebetween in the first sub-region SA1. Two first separation portions ROP1 may be disposed in one first sub-region SA1. The wire connection electrode EP may be spaced from the first electrode RME1 disposed in the corresponding sub-pixel SPXn with a lower first separation portion ROP1 interposed therebetween, and may be spaced from the first electrode RME1 disposed in another sub-pixel SPXn with an upper first separation portion ROP1 interposed therebetween. One second separation portion ROP2 may be disposed in the second sub-region SA2, and different first electrodes RME1 may be spaced from each other in the first direction DR1.

In one or more embodiments, the wire connection electrode EP may be connected to the first voltage line VL1 of the third conductive layer through the third electrode contact hole CTA penetrating the via layer VIA. The first electrode RME1 may be connected to the wire connection electrode EP, and the electric signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2, and may be transmitted to the first electrode RME1 and the second electrode RME2.

In one or more embodiments, a relative arrangement of the second electrode contact hole CTS may be different from that of the third electrode contact hole CTA to be described later. The second electrode contact hole CTS may be disposed at the portion of the bank layer BNL surrounding the second sub-region SA2, and the third electrode contact hole CTA may be disposed in the first sub-region SA1. Because the second electrode contact hole CTS and the third electrode contact hole CTA expose the top surfaces of different voltage lines VL2 and VL1, respectively, the positions of the electrode contact holes may be determined to correspond thereto.

The bank layer BNL may surround the emission area EMA and the plurality of sub-regions SA1 and SA2 similarly to the above-described embodiment. However, in the embodiment in which the display device 10 includes the sub-regions SA1 and SA2 distinguished from each other, the areas surrounded by the bank layer BNL may be distinguished from each other. The bank layer BNL is the same as that in the above-described embodiment except that it surrounds different sub-regions SA1 and SA2.

The plurality of light emitting elements ED may be disposed on different electrodes RME between different bank patterns BP1 and BP2. The light emitting element ED may include the first light emitting element ED1 having both ends disposed on the first electrode RME1 and the second electrode branch portion RM_B2 of the second electrode RME2, and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The plurality of connection electrodes CNE (CNE1, CNE2, and CNE3) may include a first connection electrode CNE1, a second connection electrode CNE2, and a third connection electrode CNE3.

The first connection electrode CNE1 may have a shape extending in the first direction DR1 and may be disposed on the first electrode RME1. A portion of the first connection electrode CNE1 disposed on the first bank pattern BP1 may overlap the first electrode RME1, and may extend therefrom in the first direction DR1 to be disposed in the first sub-region SA1 located on the upper side of the emission area EMA over the bank layer BNL. The first connection electrode CNE1 may be in contact with the first electrode RME1 through the first contact portion CT1 in the first sub-region SA1.

The second connection electrode CNE2 may have a shape extending in the first direction DR1 and may be disposed on the second electrode RME2. A portion of the second connection electrode CNE2 disposed on the second bank pattern BP2 may overlap the second electrode RME2, and may extend therefrom in the first direction DR1 to be disposed in the first sub-region SA1 located on the upper side of the emission area EMA over the bank layer BNL. The second connection electrode CNE2 may be in contact with the second electrode RME2 through the second contact portion CT2 in the first sub-region SA1.

In one or more embodiments, in the sub-pixel SPXn adjacent to the sub-pixel SPXn of FIG. 22 in the first direction DR1, the first connection electrode CNE1 and the second connection electrode CNE2 may be in contact with the first electrode RME1 and the second electrode RME2 through the contact portions CT1 and CT2 disposed in the second sub-region SA2, respectively.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 while facing (e.g., opposing) the first connection electrode CNE1 in the emission area EMA, and the second extension portion CN_E2 may be disposed on the first electrode RME1 while facing (e.g., opposing) the second connection electrode CNE2 in the emission area EMA. The first connection portion CN_B1 may extend in the second direction DR2 on the bank layer BNL disposed on the lower side of the emission area EMA to connect the first extension portion CN_E1 to the second extension portion CN_E2. The third connection electrode CNE3 may be disposed on the emission area EMA and the bank layer BNL, and may not be directly connected to the electrode RME. The second electrode branch portion RM_B2 disposed under the first extension portion CN_E1 may be electrically connected to the second voltage line VL2, and the second power voltage applied to the second electrode branch portion RM_B2 may not be transmitted to the third connection electrode CNE3.

Similarly to the above-described embodiments, In one or more embodiments, in the display device 10_2 of FIG. 22, the second insulating layer PAS2 may include the plurality of openings OP1, OP2, OP3, and OP4. The first opening OP1 and the second opening OP2 of the second insulating layer PAS2 may be disposed to overlap a part of the electrodes RME1 and RME2 while exposing one ends of the light emitting elements ED. The third opening OP3 of the second insulating layer PAS2 may be disposed on the bank layer BNL, and the fourth opening OP4 may be disposed on the first electrode RME1 to overlap the first bank pattern BP1. The third opening OP3 may be disposed in an area other than the emission area EMA, and the fourth opening OP4 may be disposed in an area where the light emitting elements ED are not disposed above the electrodes RME of emission area EMA, while being spaced from the first and second openings OP1 and OP2.

According to one or more embodiments, the display device 10 may include a hole disposed between the second electrode branch portion RM_B2 of the second electrode RME2 and the bank layer BNL in the emission area EMA. The hole may be formed to extend in the first direction DR1 between the second electrode branch portion RM_B2 and the bank layer BNL while penetrating the second insulating layer PAS2 and the third insulating layer PAS3. The hole HP may provide a path through which lights emitted from the light emitting element ED and totally reflected in the connection electrode CNE or the first insulating layer PAS1 are emitted. However, the present disclosure is not limited thereto, and the hole HP may be omitted.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:
a plurality of electrodes comprising a first electrode on a substrate and extending in a first direction, a second electrode spaced from the first electrode in a second direction, a third electrode between the first electrode and the second electrode, and a fourth electrode spaced from the second electrode in the second direction, the first electrode, the second electrode, the third electrode, and the fourth electrode being entirely spaced apart from each other in the second direction perpendicular to a thickness direction of the substrate;
a first insulating layer on the plurality of electrodes;
a plurality of light emitting elements on the plurality of electrodes that are spaced from each other in the second direction on the first insulating layer;
a second insulating layer on the first insulating layer and the plurality of light emitting elements and including a plurality of openings; and
a plurality of connection electrodes on at least some of the plurality of electrodes, in contact with the plurality of light emitting elements, and spaced from each other in the first direction and the second direction,
wherein the plurality of electrodes are sequentially arranged in an order of the first electrode, the third electrode, the second electrode, and the fourth electrode on the substrate along the second direction,
wherein the plurality of light emitting elements comprises:
a first light emitting element on the first electrode and the third electrode; and
a second light emitting element on the second electrode and the fourth electrode, and
wherein the second insulating layer includes:
a plurality of first openings overlapping the first electrode and the plurality of light emitting elements, the plurality of first openings being spaced from each other in the first direction,
a plurality of second openings overlapping the second electrode and the plurality of light emitting elements, the plurality of second openings being spaced from each other in the first direction,
a third opening that does not overlap the plurality of light emitting elements and the plurality of electrodes, and
a fourth opening overlapping the second electrode and the third electrode without overlapping the light emitting elements.

2. The display device of claim 1, further comprising a bank layer on the first insulating layer and surrounding an emission area in which the light emitting elements are located,
wherein the plurality of first openings, the plurality of second openings, and the fourth opening are located in the emission area, and the third opening is located on the bank layer.

3. The display device of claim 2, further comprising one electrode of a storage capacitor located on the substrate and overlapping the bank layer, wherein the third opening overlaps the one electrode of the storage capacitor.

4. The display device of claim 2, wherein the second insulating layer further includes:
a plurality of fifth openings overlapping the third electrode and the plurality of light emitting elements, the plurality of fifth openings being spaced from each other in the first direction; and
a plurality of sixth openings overlapping the fourth electrode and the plurality of light emitting elements, the plurality of sixth openings being spaced from each other in the first direction.

5. The display device of claim 4, wherein the fourth opening is located between the plurality of fifth openings and the plurality of second openings to overlap a region between the second electrode and the third electrode.

6. The display device of claim 4, wherein the plurality of light emitting elements further comprises:
a third light emitting element on the first electrode and the third electrode and spaced from the first light emitting element in the first direction, and
a fourth light emitting element on the second electrode and the fourth electrode and spaced from the second light emitting element in the first direction.

7. The display device of claim 6, wherein the plurality of first openings overlaps first ends of the first light emitting element and the third light emitting element,
wherein the plurality of second openings overlaps second ends of the second light emitting element and the fourth light emitting element,
wherein the plurality of fifth openings overlaps second ends of the first light emitting element and the third light emitting element, and
wherein the plurality of sixth openings overlaps first ends of the second light emitting element and the fourth light emitting element.

8. The display device of claim 4, wherein the plurality of connection electrodes comprises:
a first connection electrode on the first electrode and overlapping a first opening from among the plurality of first openings, the first connection electrode being located at a lower region of the emission area; and
a second connection electrode located on the second electrode and overlapping a second opening from among the plurality of second openings, the second connection electrode being located at the lower region of the emission area.

9. The display device of claim 8, wherein the plurality of connection electrodes further comprises:
a third connection electrode comprising a first extension portion on the third electrode, and a second extension portion on the first electrode and spaced from the first connection electrode in the first direction;
a fourth connection electrode comprising a third extension portion on the fourth electrode, and a fourth extension portion on the second electrode and spaced from the second connection electrode in the first direction; and a fifth connection electrode comprising a fifth extension portion on the third electrode, and a sixth extension portion on the fourth electrode and spaced from the third extension portion in the first direction.

10. The display device of claim 9, wherein the first extension portion overlaps the plurality of fifth openings located at the lower region of the emission area, wherein the second extension portion overlaps the plurality of first openings located at an upper region of the emission area, wherein the third extension portion overlaps the plurality of sixth openings located at the lower region of the emission area, wherein the fourth extension portion overlaps the plurality of second openings located at the upper region of the emission area, wherein the fifth extension portion overlaps the plurality of fifth openings located at the upper region of the emission area, and wherein the sixth extension portion overlaps the plurality of sixth openings located at the upper region of the emission area.

11. The display device of claim 4, further comprising a third insulating layer on the second insulating layer, wherein the third insulating layer is on the third opening and the fourth opening.

12. The display device of claim 11, wherein the third insulating layer is in contact with a portion of the first insulating layer exposed by the fourth opening.

13. The display device of claim 11, wherein the plurality of first openings and the plurality of second openings that are located at a lower region of the emission area, and the plurality of fifth openings and the plurality of sixth openings that are located at an upper region of the emission area penetrate the third insulating layer.

14. The display device of claim 4, wherein a length of each of the third opening and the fourth opening measured in the first direction are greater than a length of each of the plurality of first openings, the plurality of second openings, the plurality of fifth openings, and the plurality of sixth openings measured in the first direction.

15. A display device comprising:

a first electrode, a second electrode spaced from the first electrode, a third electrode, and a fourth electrode, wherein the first electrode, the second electrode, the third electrode, and the fourth electrode are entirely spaced apart from each other in a first direction perpendicular to a thickness direction of the display device;

a first insulating layer on the first electrode and the second electrode;

a first plurality of light emitting elements each having a first end on the first electrode and a second end on the third electrode on the first insulating layer;

a second light emitting element on the second electrode and the fourth electrode;

a bank layer on the first insulating layer and surrounding an emission area in which the first plurality of light emitting elements are located;

a second insulating layer on the first insulating layer and the first plurality of light emitting elements and including a plurality of openings;

a first connection electrode on the first electrode; and a second connection electrode on the second electrode, wherein the first to fourth electrodes are sequentially arranged in an order of the first electrode, the third electrode, the second electrode, and the fourth electrode on a substrate of the display device along the first direction, and wherein the second insulating layer includes:

a first opening overlapping the first electrode and one of the ends of the first plurality of light emitting elements;

a second opening overlapping the second electrode and other of the ends of the first plurality of light emitting elements; and a third opening that does not overlap the first plurality of light emitting elements, the first electrode, and the second electrode.

16. The display device of claim 15, wherein the first connection electrode partially overlaps the first opening and is in contact with the one of the ends of the first plurality of light emitting elements, and wherein the second connection electrode partially overlaps the second opening and is in contact with the other of the ends of the first plurality of light emitting elements.

17. The display device of claim 15, further comprising a third insulating layer on the second insulating layer and the second connection electrode, wherein the first opening penetrates the second insulating layer and the third insulating layer.

18. The display device of claim 17, wherein the third insulating layer covers the second opening and the third opening.

19. The display device of claim 17, wherein the third opening overlaps the bank layer.

20. The display device of claim 15, wherein the second insulating layer further includes a fourth opening on the first electrode without overlapping the first plurality of light emitting elements.

* * * * *